United States Patent
Usadi et al.

(10) Patent No.: US 8,725,481 B2
(45) Date of Patent: May 13, 2014

(54) PARALLEL ADAPTIVE DATA PARTITIONING ON A RESERVOIR SIMULATION USING AN UNSTRUCTURED GRID

(71) Applicants: Adam K. Usadi, Basking Ridge, NJ (US); Ilya D Mishev, Houston, TX (US)

(72) Inventors: Adam K. Usadi, Basking Ridge, NJ (US); Ilya D Mishev, Houston, TX (US)

(73) Assignee: ExxonMobil Upstream Research Company, Houston, TX (US)

( * ) Notice: Subject to any disclaimer, the term of this patent is extended or adjusted under 35 U.S.C. 154(b) by 0 days.

(21) Appl. No.: 13/856,300

(22) Filed: Apr. 3, 2013

(65) Prior Publication Data

US 2013/0246030 A1    Sep. 19, 2013

Related U.S. Application Data

(63) Continuation of application No. 12/682,731, filed as application No. PCT/US2008/080508 on Oct. 20, 2008, now Pat. No. 8,437,996.

(60) Provisional application No. 61/007,470, filed on Dec. 13, 2007.

(51) Int. Cl.
 *G06G 7/48* (2006.01)
 *E21B 49/00* (2006.01)
 *E21B 43/00* (2006.01)

(52) U.S. Cl.
 CPC ............... *E21B 49/00* (2013.01); *E21B 43/00* (2013.01)
 USPC ................................................ 703/10; 702/6

(58) Field of Classification Search
 USPC ............................................. 703/9–10; 702/6
 See application file for complete search history.

(56) References Cited

U.S. PATENT DOCUMENTS

| | | | |
|---|---|---|---|
| 5,604,911 | A | 2/1997 | Ushiro |
| 5,657,223 | A | 8/1997 | Juszczak et al. |
| 5,710,726 | A | 1/1998 | Rowney et al. |
| 5,747,673 | A | 5/1998 | Ungerer et al. |
| 6,101,447 | A | 8/2000 | Poe, Jr. |
| 6,108,608 | A | 8/2000 | Watts, III |
| 6,230,101 | B1 | 5/2001 | Wallis |
| 6,381,543 | B1 | 4/2002 | Guerillot et al. |

(Continued)

FOREIGN PATENT DOCUMENTS

| | | |
|---|---|---|
| EP | 1462605 | 3/2004 |
| EP | 1865343 | 8/2007 |

(Continued)

OTHER PUBLICATIONS

Chandra et al. "Dynamic Structured Partitioning for parallel Scientific Applications with Pointwise Varying Workloads". 2006 IEEE. 10 Pages.*

(Continued)

*Primary Examiner* — Eunhee Kim
(74) *Attorney, Agent, or Firm* — ExxonMobil Upstream Research Company, Law Dept.

(57) ABSTRACT

A computer implemented system and method for parallel adaptive data partitioning on a reservoir simulation using an unstructured grid includes a method of simulating a reservoir model which includes generating the reservoir model. The generated reservoir model is partitioned into multiple sets of different domains, each one corresponding to an efficient partition for a specific portion of the model.

10 Claims, 28 Drawing Sheets

(56) References Cited

U.S. PATENT DOCUMENTS

| | | |
|---|---|---|
| 6,453,727 B1 | 9/2002 | Lenormand et al. |
| 6,585,044 B2 | 7/2003 | Rester et al. |
| 6,668,922 B2 | 12/2003 | Zlauddin et al. |
| 6,928,399 B1 * | 8/2005 | Watts et al. .................. 703/2 |
| 6,977,866 B2 | 12/2005 | Huffman et al. |
| 6,985,841 B2 | 1/2006 | Barroux |
| 7,181,380 B2 | 2/2007 | Dusterhoft et al. |
| 7,225,078 B2 | 5/2007 | Shelley et al. |
| 7,363,163 B2 | 4/2008 | Valec-Dupin et al. |
| 7,363,206 B2 | 4/2008 | Jones et al. |
| 7,369,979 B1 | 5/2008 | Spivey |
| 7,395,252 B2 | 7/2008 | Anderson et al. |
| 7,516,016 B2 | 4/2009 | DeMartini et al. |
| 7,526,418 B2 | 4/2009 | Pita et al. |
| 7,526,953 B2 | 5/2009 | Goodwin et al. |
| 7,561,997 B1 | 7/2009 | Miller |
| 7,610,251 B2 | 10/2009 | Shayegi et al. |
| 7,617,082 B2 | 11/2009 | Childs et al. |
| 7,620,534 B2 | 11/2009 | Pita et al. |
| 7,627,461 B2 | 12/2009 | Guyaguler et al. |
| 7,634,395 B2 | 12/2009 | Flandrin et al. |
| 7,657,494 B2 | 2/2010 | Wilkinson et al. |
| 7,660,673 B2 | 2/2010 | Dozier |
| 7,660,711 B2 | 2/2010 | Pita et al. |
| 7,664,624 B2 | 2/2010 | Michel et al. |
| 7,672,825 B2 | 3/2010 | Brouwer et al. |
| 7,725,302 B2 | 5/2010 | Ayan et al. |
| 7,739,089 B2 | 6/2010 | Gurpinar et al. |
| 7,774,184 B2 | 8/2010 | Balci et al. |
| 7,788,074 B2 | 8/2010 | Scheidt et al. |
| 7,797,139 B2 | 9/2010 | Guthrie et al. |
| 7,809,537 B2 | 10/2010 | Hemanthkumar et al. |
| 7,809,538 B2 | 10/2010 | Thomas |
| 7,822,554 B2 | 10/2010 | Zuo et al. |
| 7,835,893 B2 | 11/2010 | Cullick et al. |
| 7,860,654 B2 | 12/2010 | Stone |
| 7,920,970 B2 | 4/2011 | Zuo et al. |
| 7,925,482 B2 | 4/2011 | Kennon et al. |
| 8,095,349 B2 | 1/2012 | Kelkar et al. |
| 8,131,526 B2 | 3/2012 | Neville |
| 8,150,669 B2 | 4/2012 | Cacas et al. |
| 8,240,378 B2 | 8/2012 | Sonne et al. |
| 8,265,915 B2 | 9/2012 | Hsu et al. |
| 8,392,164 B2 | 3/2013 | Busby et al. |
| 8,423,337 B2 | 4/2013 | Hsu et al. |
| 2002/0050989 A1 | 5/2002 | Sanstrom |
| 2002/0180728 A1 | 12/2002 | Neff et al. |
| 2002/0180732 A1 | 12/2002 | Docherty |
| 2003/0112235 A1 | 6/2003 | Grace |
| 2004/0006450 A1 | 1/2004 | Hale |
| 2004/0008891 A1 | 1/2004 | Wentland et al. |
| 2007/0112547 A1 | 5/2007 | Ghorayeb et al. |
| 2008/0154563 A1 | 6/2008 | Kumar et al. |
| 2009/0012765 A1 | 1/2009 | Raphael |
| 2009/0210174 A1 | 8/2009 | Stone et al. |
| 2009/0222246 A1 | 9/2009 | Do et al. |
| 2009/0250211 A1 | 10/2009 | Craig |
| 2010/0132450 A1 | 6/2010 | Pomerantz et al. |
| 2010/0145667 A1 | 6/2010 | Niu et al. |
| 2010/0185427 A1 | 7/2010 | Tilke et al. |
| 2010/0198638 A1 | 8/2010 | Deffenbaugh et al. |
| 2010/0206559 A1 | 8/2010 | Sequeira, Jr. et al. |
| 2010/0250215 A1 | 9/2010 | Kennon et al. |
| 2010/0286971 A1 | 11/2010 | Middya et al. |
| 2010/0299125 A1 | 11/2010 | Ding et al. |
| 2010/0325075 A1 | 12/2010 | Goel et al. |
| 2010/0332205 A1 | 12/2010 | Tillier et al. |
| 2010/0332442 A1 | 12/2010 | Goel et al. |
| 2011/0011595 A1 | 1/2011 | Huang et al. |
| 2011/0022363 A1 | 1/2011 | Furman et al. |
| 2011/0029273 A1 | 2/2011 | Lovell |
| 2011/0077922 A1 | 3/2011 | Moncorge et al. |

FOREIGN PATENT DOCUMENTS

| | | |
|---|---|---|
| WO | WO 91/04544 | 4/1991 |
| WO | WO 98/27498 | 6/1998 |
| WO | WO 98/34190 | 8/1998 |
| WO | WO 99/40532 | 8/1999 |
| WO | WO 00/19380 | 4/2000 |
| WO | WO 00/42576 | 7/2000 |
| WO | WO 00/49562 | 8/2000 |
| WO | WO 01/23829 | 4/2001 |
| WO | WO 01/24099 | 4/2001 |
| WO | WO 01/27750 | 4/2001 |
| WO | WO 01/27755 | 4/2001 |
| WO | WO 01/27858 | 4/2001 |
| WO | WO 01/33481 | 5/2001 |
| WO | WO 01/40937 | 6/2001 |
| WO | WO 01/46673 | 6/2001 |
| WO | WO 01/75588 | 10/2001 |
| WO | WO 01/81914 | 11/2001 |
| WO | WO 02/01251 | 1/2002 |
| WO | WO 02/03262 | 1/2002 |
| WO | WO 02/03264 | 1/2002 |
| WO | WO 02/21158 | 3/2002 |
| WO | WO 02/47030 | 6/2002 |
| WO | WO 03/081233 | 10/2003 |
| WO | WO 2004/008338 | 1/2004 |
| WO | WO 2007/076044 | 7/2007 |
| WO | WO 2009/035897 | 3/2009 |
| WO | WO 2009/084973 | 7/2009 |
| WO | WO 2010/033716 | 3/2010 |
| WO | WO 2010/062710 | 6/2010 |
| WO | WO 2010/065774 | 6/2010 |
| WO | WO 2010/075096 | 7/2010 |
| WO | WO 2010/120492 | 10/2010 |
| WO | WO 2010/138558 | 12/2010 |
| WO | WO 2011/019565 | 2/2011 |

OTHER PUBLICATIONS

US 7,246,661, 07/24/2007, Carlson (withdrawn).

* cited by examiner

902e →

PARALLEL ADAPTIVE DATA PARTITIONING ON A RESERVOIR SIMULATION USING AN UNSTRUCTURED GRID

CROSS-REFERENCE TO RELATED APPLICATIONS

This application is a Continuation of U.S. patent application Ser. No. 12/682,731, filed on Apr. 12, 2010, which is the National Stage entry under 35 U.S.C. 371 of PCT/US2008/080508 that published as WO 2009/075945 and was filed on 20 Oct. 2008, which claims the benefit of U.S. Provisional Application No. 61/007,470, filed on 13 Dec. 2007, each of which is incorporated by reference, in its entirety, for all purposes.

BACKGROUND

This invention relates generally to oil and gas production, and in particular to the use of reservoir simulations to facilitate oil and gas production.

SUMMARY

In one general aspect, a method of simulating a reservoir model includes generating the reservoir model; and partitioning the generated reservoir model into multiple sets of different domains, each one corresponding to an efficient partition for a specific portion of the model.

Implementations of this aspect may include one or more of the following features. For example, simulating the reservoir model may include dividing the simulating of the reservoir into a plurality of processing elements; and processing a plurality of the processing elements in parallel, based on the partitions. Simulating the reservoir simulation in parallel may include re-partitioning the generated reservoir model into a plurality of domains dynamically in order to improve parallel performance. Re-partitioning the generated reservoir model into a plurality of domains may include a) pre-processing the reservoir model by choosing a partitioning scheme and determining its parameters; b) partitioning the generated reservoir model into a plurality of domains using the partitioning scheme; c) post-processing the partitioned reservoir model to further refine the parallel performance of the partitioned calculation; d) evaluating a quality of the post-processed partitioned reservoir model; and e) if the quality of the post-processed partitioned reservoir model is less than a predetermined value, then repeating a, b, c, d, and e using a modified partitioning scheme and parameters. Partitioning the generated reservoir model into a plurality of domains may include identifying subsets or blocks of nodes which are isolated from each other; weighting the sorted blocks of nodes to account for processing costs associated with each block; sorting these blocks of nodes based on processing cost; and allocating the weighted blocks of nodes to corresponding domains. Partitioning the generated reservoir model into a plurality of domains may include determining a level of processing cost associated with each node within the generated reservoir model; sorting the nodes in a geometric direction; binning the weighted, sorted nodes based on processing costs to generate bins of equal weight; and assigning nodes from the bins to domains. Partitioning the generated reservoir model into a plurality of domains may include determining a velocity field associated with the generated reservoir model; tracing streamlines associated with the velocity field; projecting the streamlines to generate stream curtains; and extending the stream curtains to boundaries of the generated reservoir model to partition the generated reservoir model into domains. Partitioning the generated reservoir model into a plurality of domains may include determining a processing cost associated with each of the nodes of the generated reservoir model; determining a processing cost associated with the connectivity level between each of the nodes of the generated reservoir model; and partitioning the generated reservoir model into a plurality of domains as a function of the determined processing costs.

Partitioning the generated reservoir model into a plurality of domains as a function of the determined processing costs and connectivity levels may include grouping nodes having a connectivity above a predetermined level within the same domains. Partitioning the generated reservoir model into a plurality of domains may include partitioning the domains; determining the distances between the boundaries of the domains and adjacent wells defined within the generated reservoir model; and re-partitioning the generated reservoir model as required as a function of the determined distances in order to move the domain partition away from the wells and thus improve the solver performance.

Partitioning the domains may include identifying subsets or blocks of nodes which are isolated from each other; weighting the sorted blocks of nodes to account for processing costs associated with each block; sorting these blocks of nodes based on processing cost; and allocating the weighted blocks of nodes to corresponding domains. Partitioning the domains may include determining a level of processing cost associated with each node within the generated reservoir model; sorting the nodes in a geometric direction; binning the weighted, sorted nodes based on processing costs to generate bins of equal weight; and assigning nodes from the bins to domains. Partitioning the domains may include determining a velocity field associated with the generated reservoir model; tracing streamlines associated with the velocity field; projecting the streamlines to generate stream curtains; and extending the stream curtains to boundaries of the generated reservoir model to partition the generated reservoir model into domains. Partitioning the domains may include determining a processing cost associated with each of the nodes of the generated reservoir model; determining a processing cost associated with the connectivity level between each of the nodes of the generated reservoir model; and partitioning the generated reservoir model into a plurality of domains as a function of the determined processing costs. Partitioning the generated reservoir model into a plurality of domains may include partitioning the domains; determining all nodes within the generated reservoir model positioned along boundaries between the domains; projecting the boundary nodes to a plane and fitting a curve through the projected boundary nodes; and projecting a curve in a direction orthogonal to the fitted curve to redefine boundaries between the domains of the generated reservoir model.

Partitioning the generated reservoir model into a plurality of domains may include comparing the parallel performance partitioning of the generated partitioned reservoir model with the performance of a historical collection of partitioned reservoir models; and repartitioning the model if the performance of the new partition is not as good as that of the historical record.

In another general aspect, a method for simulating a reservoir model includes generating the reservoir model; partitioning the generated reservoir model into a plurality of domains; dividing the simulating of the reservoir into a plurality of processing elements; processing a plurality of the processing elements in parallel; and partitioning the generated reservoir model into another plurality of domains at least once during the parallel processing; wherein partitioning the generated reservoir model into a plurality of domains includes: a) pre-processing the reservoir model by choosing a partitioning scheme and determining its parameters; b) partitioning the generated reservoir model into a plurality of domains using a partition scheme; c) post-processing the partitioned reservoir model to correct the partitioned reservoir model further refine the parallel performance of the partitioned calculation; d) evaluating a quality of the post-processed partitioned reservoir model; and e) if the quality of the post-processed partitioned reservoir model is less than a predetermined value, then repeating a, b, c, and d, and e with properly modified partitioning scheme and/or its parameters.

In another general aspect, a method for simulating a reservoir model may include generating the reservoir model; partitioning the generated reservoir model into a plurality of domains; dividing the simulating of the reservoir into a plurality of processing elements; processing a plurality of the processing elements in parallel; and partitioning the generated reservoir model into another plurality of domains at least once during the parallel processing.

Partitioning the generated reservoir model into a plurality of domains may include any one of the following. Specifically, partitioning the domains may include identifying subsets or blocks of nodes which are isolated from each other; weighting the sorted blocks of nodes to account for processing costs associated with each block; sorting these blocks of nodes based on processing cost; and allocating the weighted blocks of nodes to corresponding domains. Partitioning the domains may include determining a level of processing cost associated with each node within the generated reservoir model; sorting the nodes in a geometric direction; binning the weighted, sorted nodes based on processing costs to generate bins of equal weight; and assigning nodes from the bins to domains. Partitioning the domains may include determining a velocity field associated with the generated reservoir model; tracing streamlines associated with the velocity field; projecting the streamlines to generate stream curtains; and extending the stream curtains to boundaries of the generated reservoir model to partition the generated reservoir model into domains. Partitioning the domains may include determining a processing cost associated with each of the nodes of the generated reservoir model; determining a processing cost associated with the connectivity level between each of the nodes of the generated reservoir model; and partitioning the generated reservoir model into a plurality of domains as a function of the determined processing costs. Partitioning the generated reservoir model into a plurality of domains may include partitioning the domains; determining all nodes within the generated reservoir model positioned along boundaries between the domains; projecting the boundary nodes to a plane and fitting a curve through the projected boundary nodes; and projecting a curve in a direction orthogonal to the fitted curve to redefine boundaries between the domains of the generated reservoir model.

One or more of the foregoing aspects may be used to simulate a reservoir model, which in turn may be relied upon to control hydrocarbon production activities based on the simulated results of the reservoir model. The production of hydrocarbons may be controlled, e.g., production rates from surface facilities may be controlled based on results interpreted from the simulated reservoir model(s).

BRIEF DESCRIPTION OF THE DRAWINGS

FIG. 6b is a flow chart illustration of the partition logic of the well management of the simulator of FIG. 6a.

FIG. 6c is a flow chart illustration of the partition logic of the Jacobian construction and flow calculation of the simulator of FIG. 6a.

FIG. 6d is a flow chart illustration of the partition logic of the linear solve of the simulator of FIG. 6a.

FIG. 6e is a flow chart illustration of the partition logic of the property calculations of the simulator of FIG. 6a.

DETAILED DESCRIPTION OF THE ILLUSTRATIVE EMBODIMENTS

Figure 1:
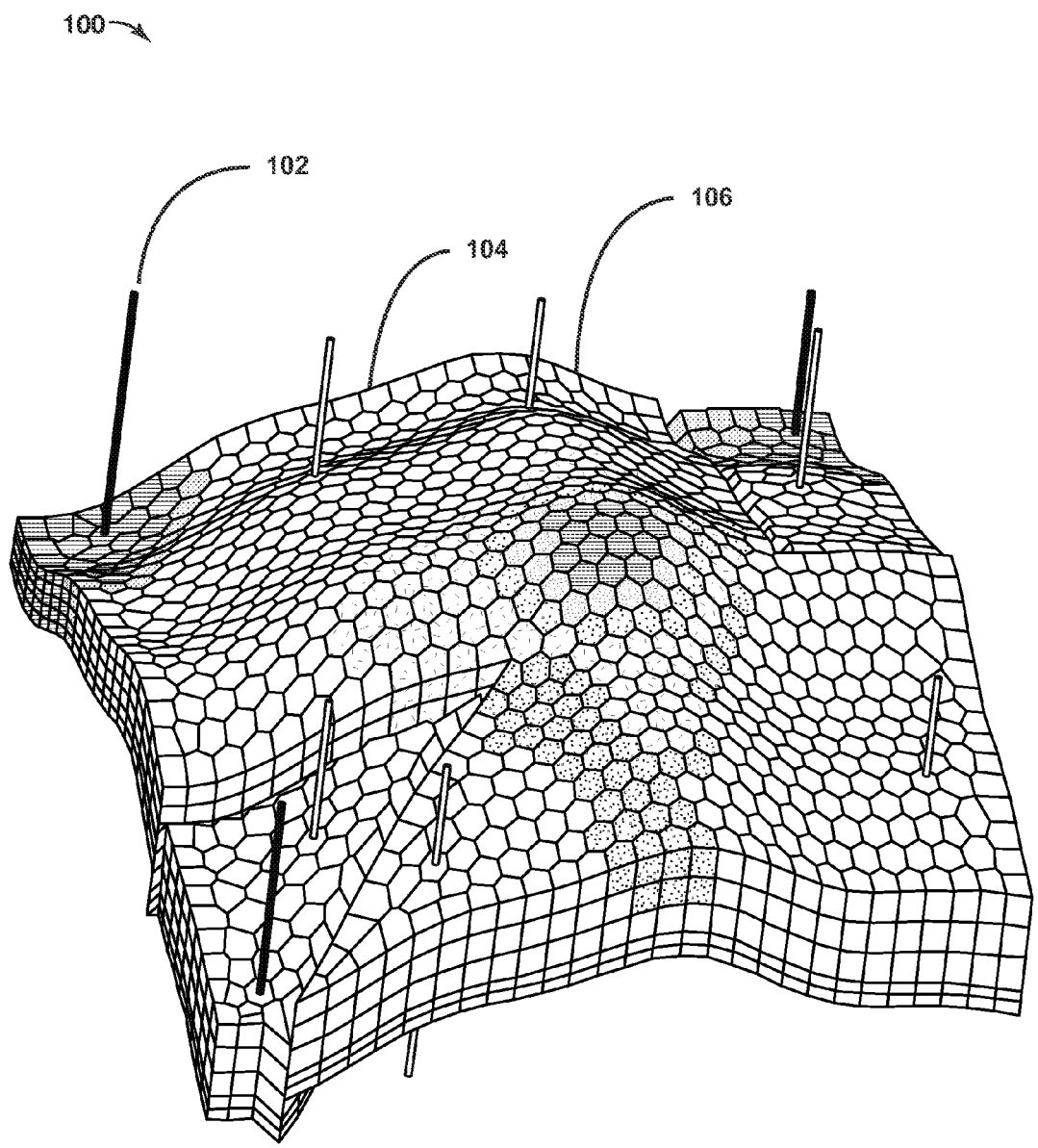
FIG. 1 is an illustration of a reservoir simulation model including a grid mesh that defines a plurality of nodes.

Referring initially to FIG. 1, an exemplary embodiment of a typical 3-dimensional reservoir model 100 for simulating the operation of an oil and/or gas reservoir includes one or more vertical wells 102. In an exemplary embodiment, the model 100 is broken up into a plurality of nodes 104 by a grid mesh 106. In an exemplary embodiment, the nodes 104 of the model 100 are of non-uniform size.

Figure 2:
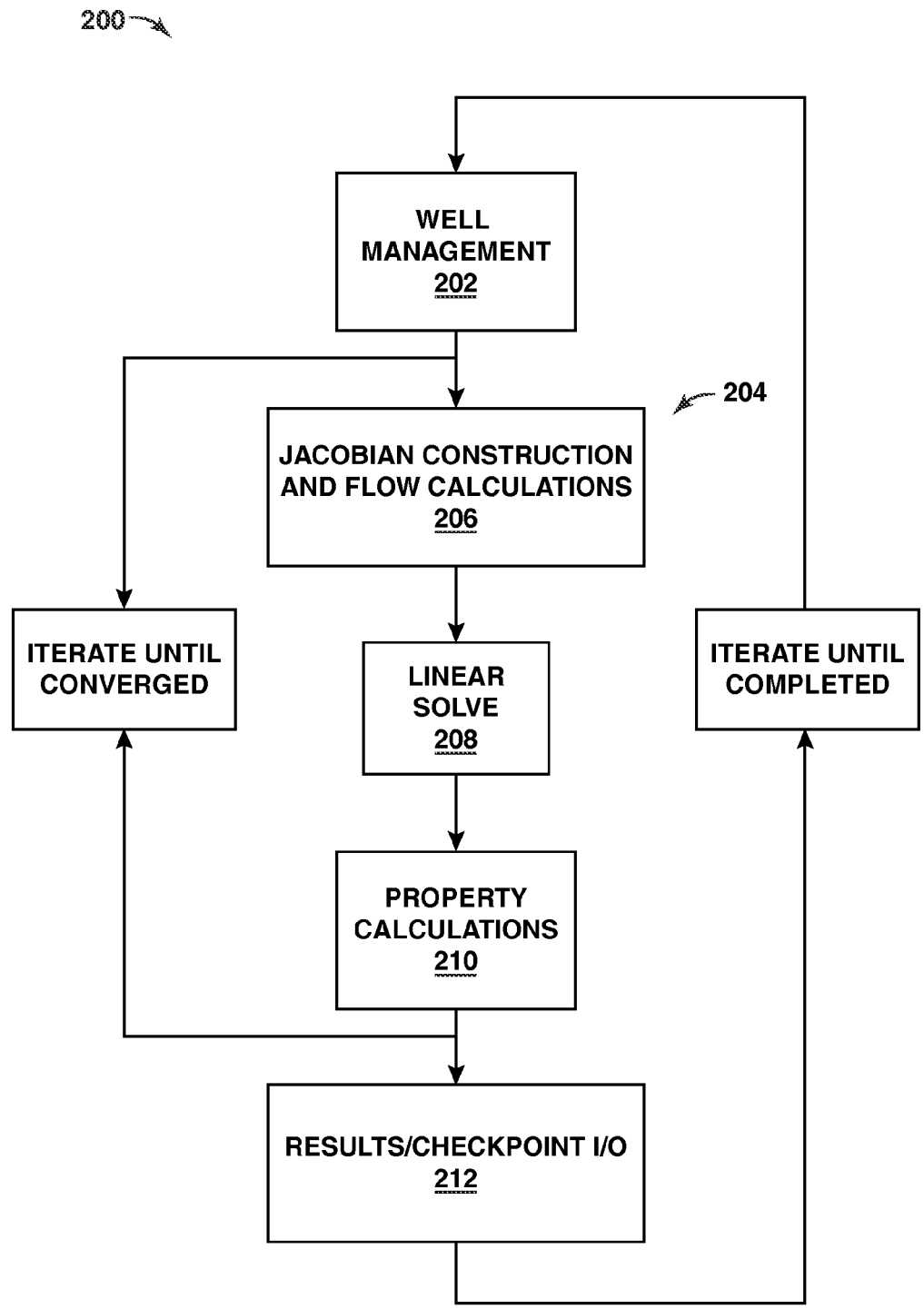
FIG. 2 is a flow chart illustration of a simulator for simulating the operation of the model of FIG. 1.

In an exemplary embodiment, as illustrated in FIG. 2, the operation of the model 100 is simulated using a conventional reservoir simulator 200 in which well management 202 is performed for the well and surface facility network of the model. In an exemplary embodiment, the well management 202 is performed over all wells such as that shown by 102 in the model 100 includes a conventional iterative process 204 in which a conventional Jacobian construction and flow calculation 206 is performed, followed by a conventional linear solve 208 and conventional property calculations 210. In an exemplary embodiment, the linear solve 208 and/or the property calculations 210 are performed over large arrays of data that represent properties such as, for example, pressure and composition at mesh points in the grid 106.

In an exemplary embodiment, upon the completion of the process 204 for the wells 102 in the model, the simulated data for the entire reservoir model is then generated in a conventional results/checkpoint I/O 212.

In an exemplary embodiment, the reservoir simulator 200 may be implemented, for example, using one or more general purpose computers, special purpose computers, analog processors, digital processors, central processing units, and/or distributed computing systems.

In an exemplary embodiment, the model 100 and simulator 200 are used to simulate the operation of the reservoir to thereby permit the modeling of fluids, energy, and/or gases flowing in the hydrocarbon reservoirs, wells, and related surface facilities. Reservoir simulation is one part of reservoir modeling which also includes the construction of the simulation data to accurately represent the reservoir. The goal of a simulation is to understand the flow patterns in order to optimize some strategy for producing hydrocarbons from some set of wells and surface facilities. The simulation is usually part of a time consuming, iterative process to reduce uncertainty about a particular reservoir model description while optimizing a production strategy. Reservoir simulation, for example, is one kind of computational fluid dynamics simulation.

The calculations performed by the simulator 200 typically are, for the most part, performed over large arrays of data which represent physical properties such as pressure and composition at the mesh points in the grid 106. As time progresses, the relative costs of parts of the operation of the simulator 200 may vary. For example, the linear solve 208 may become considerably more expensive than the Jacobian construction 206. This may be due to the nature of the physical processes which are being modeled or due to properties of the algorithm. For example, the reservoir simulator 200 may start out with a single hydrocarbon phase. But as the pressure of the reservoir drops due to oil production, the pressure may drop below the bubble point of the fluids so gas may come out of solution. This may, in turn, make the property calculations 210 more expensive, but not affect the linear solve 208 very much. The net effect is to make the property calculations use a larger percentage of the total calculation time. Furthermore, the cost of the property calculations may vary by grid node 104. That is, one region of the reservoir model 100 may require more calculations to converge to an adequate solution than another region.

In an exemplary embodiment, in order to decrease the runtime required for the operation of the simulator 200, one or more of the operational steps, 202, 204, 206, 208, 210 and/or 212, of the simulator may be distributed among multiple central processing units (CPU) or CPU cores within a computer in order to perform the operational steps in parallel. In an exemplary embodiment, the method of parallelization of the operational steps, 202, 204, 206, 208, 210 and/or 212, of the simulator 200 may vary by category. For example, the method by which a particular operational step of the simulator 200 is parallelized may be different from the method of parallelization of another particular operational step of the simulator. In an exemplary embodiment, the method of parallelization selected for a particular operational step of the simulator 200 may be optimized using empirical methods.

In an exemplary embodiment, the particular parallelization method selected for a particular operational step, or group of operational steps, of the simulator 200, takes into consideration whether or not the calculations associated with an operational step, or group of operational steps, are local where little or no inter-domain communication exists or global where communication across domain boundaries is required. For example, parallelization of the simulator 200 is provided, for example, by partitioning the model 100 into a plurality of domains, in an exemplary embodiment, optimal parallelization provides a good load balance and minimizes the communication between the domains of the model.

In an exemplary embodiment, parallelization may be provided by a parallelization by task. In an exemplary embodiment, parallelization by task is provided by dividing up an operational step of the simulator 200 into sub-tasks which may be run in parallel and thereby processed by multiple computers. For example, all or part of property calculations 210 may fall into this category because many of the calculations only involves calculations at a node and not flows from connected nodes. Thus, these calculations may be performed simultaneously in parallel with no non-local effects.

In an exemplary embodiment, parallelization may be provided by a parallelization by data partition.

Figure 3:
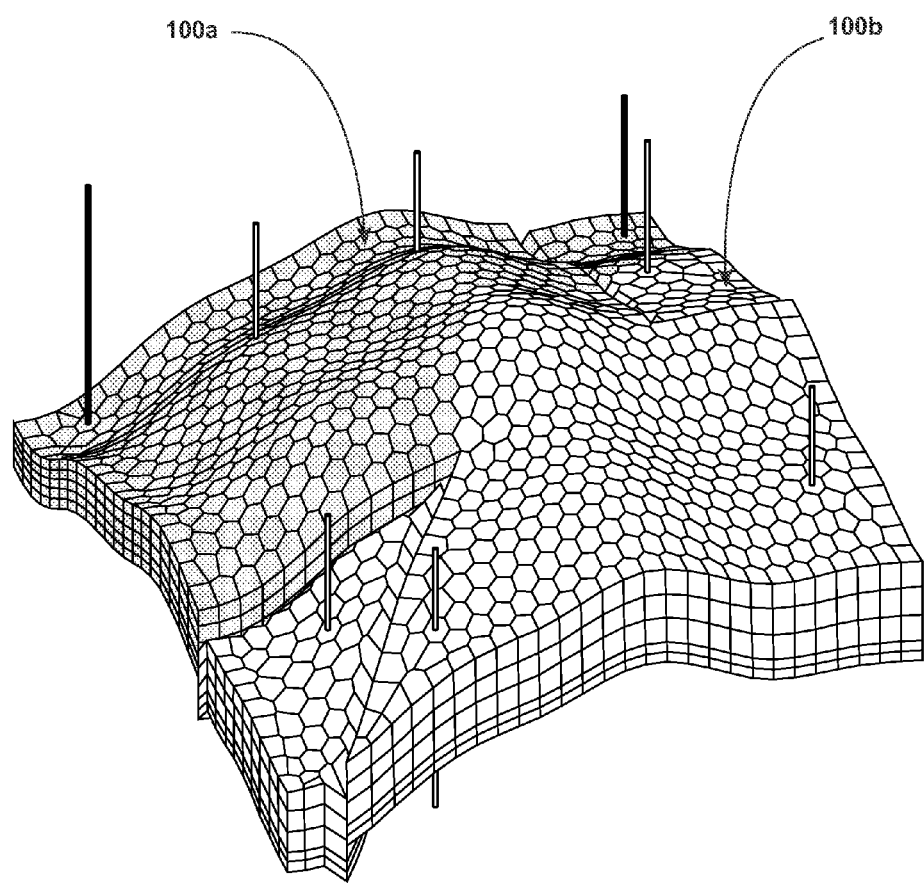
FIG. 3 is an illustration of a reservoir simulation model including a grid mesh that defines a plurality of nodes that has been partitioned into a plurality of domains.

In an exemplary embodiment, as illustrated in FIG. 3, parallelization by data partition is provided by partitioning the data within the grid 106 of the model 100 into separate domains, for example, 100a and 100b, and performing the same operational steps over each domain of the data. For example, the Jacobian construction 206 and the property calculations 210 typically fall into this category. This method of parallelization is typically good for local calculations.

In an exemplary embodiment, parallelization by data partition is provided by partitioning the data within the grid 106 of the model 100 into separate domains such as, for example, 100a and 100b, as illustrated in FIG. 3, and performing a parallel algorithm such that a large portion of the calculations of one or more of the operational steps of the simulator 200 may be performed identically over different domains of the model. In an exemplary embodiment, such as the linear solve 208, an additional global part of the calculation may be required.

In an exemplary embodiment, the calculation performed in the operational steps of the simulator 200 is parallelized by partitioning the data. In an exemplary embodiment, one or more of the calculations of one or more of the operational steps of the simulator 200 may include a corresponding partition of the data of the model 100. Furthermore, the optimal partition of the data of the model 100 may be time dependent for one or more of the calculations of one or more of the operational steps of the simulator 200. For example, the parallelization may, for example, have completely different data partitions at different points in time during the operation of the simulator 200.

Existing partitioning algorithms for simulators 200 attempt to provide an efficient load balance for each domain of the model 100 and minimize the number of the connections between the subdomains. This approach does not necessarily provide good iterative performance of a domain decomposition based parallel solver. And this is a primary motivation for the development of the methods described in this patent.

Due to the evolutionary nature of a reservoir simulator 200, the existing partition of the model 100 can become improperly load balanced or otherwise inefficient for the current state of calculations. This may happen because, for example, the cost of the property calculations depends on properties of the fluid and may change dramatically as the fluid moves and evolves. Or the linear solve 208 may encounter global convergence difficulties as the character of the linear matrix equation changes. In such a case, it is desirable to reparation the data of the model 100 in order to bring the operation of the simulator 200 back into proper load balance and to improve the iterative convergence of the linear solve 208.

Figure 4:
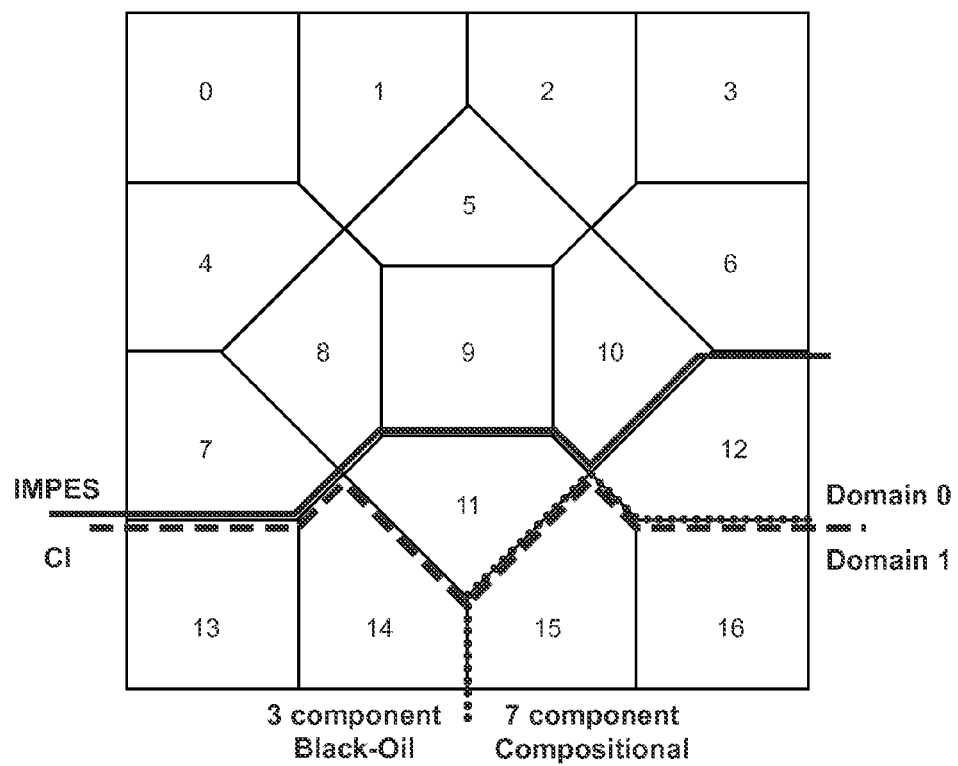
FIG. 4 is an illustration of a reservoir simulation model including a grid mesh that defines a plurality of nodes in which different nodes within the grid are modeled with different levels of implicitness and different fluid models. Furthermore, the nodes of the reservoir simulation model have been partitioned into two domains (0 & 1).
Figure 5:
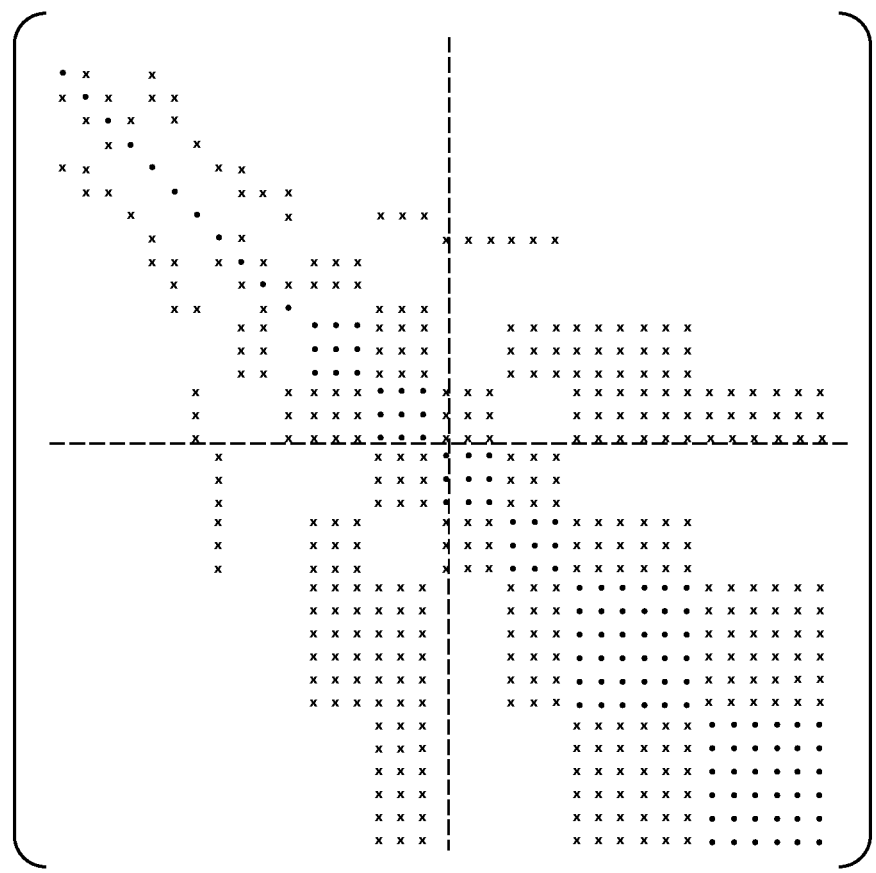
FIG. 5 is an illustration of the numerical matrix corresponding to the model of FIG. 4.

In an exemplary embodiment, the cost of the calculations during the operation of the simulator 200 may be measured by the number of components and phases by which the fluid is modeled and the level of implicitness used for the mathematical discretization. For example, as illustrated in FIGS. 4 and 5, an exemplary reservoir model 400 has a corresponding matrix equation 500 where the number of rows associated with each node is 1 for the IMPES nodes, but equal to the number of components for the CI region. IMPES refers to implicit pressure explicit saturation and CI refers to coupled implicit. Each non-zero element in the matrix equation 500 may be correlated to some number of floating point operations which translate to computational cost. More non-zero elements in a particular domain mean more work in the particular domain.

In an exemplary embodiment, a method of parallelization in the model 100 and simulator 200 provides an unstructured grid 106 adaptively in time and/or by calculation category in order to optimize parallel performance of the simulator. In an exemplary embodiment, a method of parallelization may be performed in parallel or serial. In an exemplary embodiment, a method of parallelization may be performed in the simulator 200 using shared memory parallel machines such as, for example, multi-cpu/multi-core desktop machines available today because data re-mapping is more efficient if the data can be accessed locally without sending or receiving over a network, but it could be used over the variety of parallel machines available including, for example, distributed memory cluster, cell chips, and other many-core chips.

In an exemplary embodiment, a method of parallelization includes metrics for determining when the data in the model 100 needs to be repartitioned which may be different for different calculation categories of the operational steps of the simulator 200. In an exemplary embodiment, a method of parallelization includes a variety of choices for performing the partition of data within the model 100. In an exemplary embodiment, a method of parallelization provides different partitions of data in the model 100 as a function of the calculation to be performed in an operational step of the simulator 200. Furthermore, in an exemplary embodiment, for a given calculation category in one or more of the operational steps of the simulator 200, different models 100 are best served by different types of partitions of the data in the corresponding model 100.

In an exemplary embodiment, one or more methods for parallelization include one or more of the following: 1) methods to partition data in the model 100 for optimal parallel solver algorithm convergence; 2) methods to partition solver and non-solver calculation categories in one or more of the operational steps of the simulator 200 based upon a measurement of the load balance inequities; 3) adaptation of the partitioning of data in the model dynamically based upon: a) metrics calculated as part of the operation of the simulator such as measuring the number of iterations inside the flash calculation, following phase transition fronts, etc . . . ; and/or b) historic and predictive runtime performance; 4) providing the correct node and connection weights to existing graph partition schemes; and/or 5) minimizing the cutting of facility and high throughput regions through a variety of theoretical and/or heuristic methods.

Figure 6A:
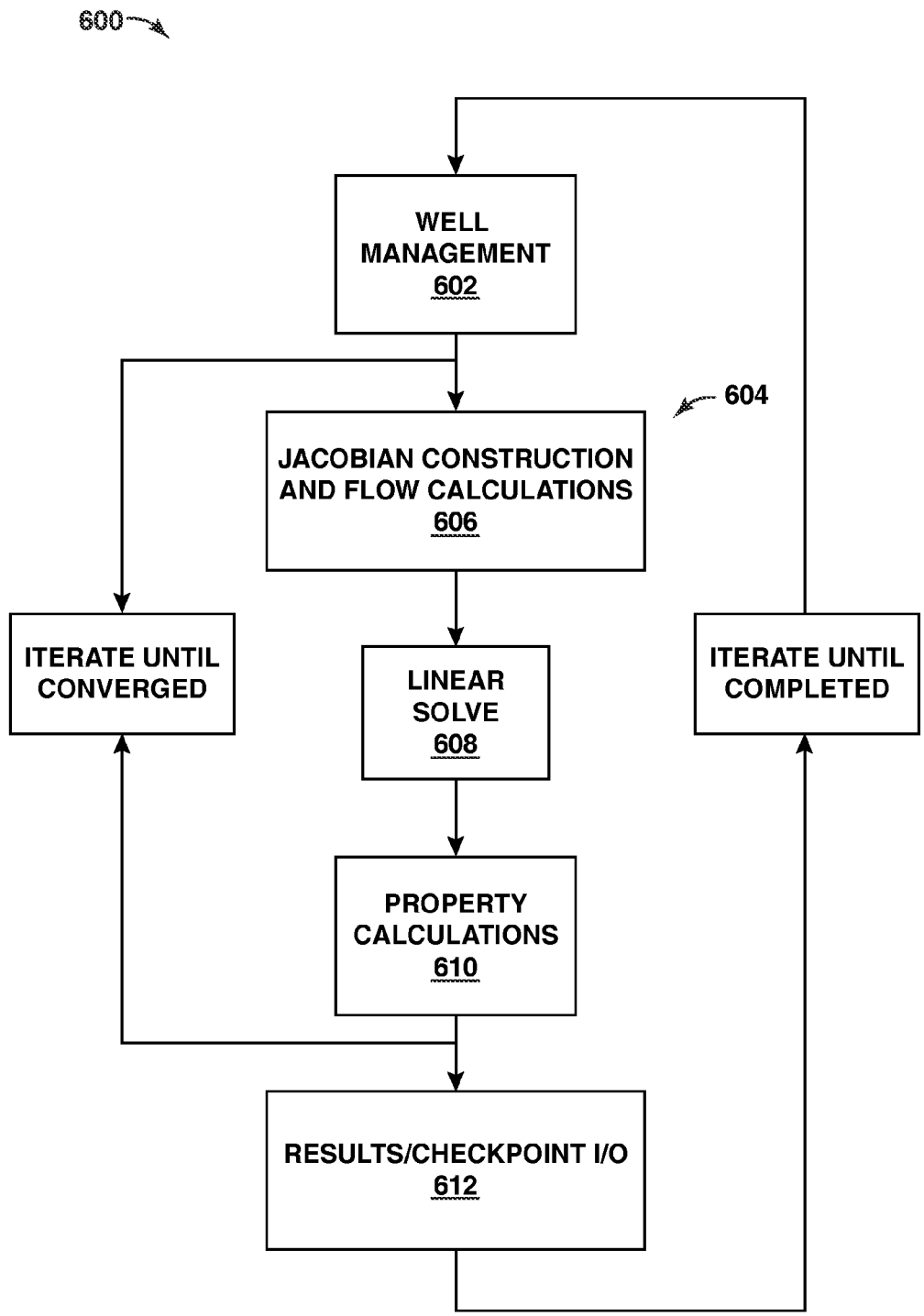
FIG. 6a is a flow chart illustration of a simulator for simulating the operation of the model of FIG. 1.

Referring to FIG. 6a, in an exemplary embodiment, the operation of the model 100 is simulated using a reservoir simulator 600 in which well management 602 is performed. In an exemplary embodiment, the well management 602 for the wells 102 in the model 100 includes an iterative process 604 in which a Jacobian construction and flow calculation 606 is performed, followed by a linear solve 608 and property calculations 610. In an exemplary embodiment, upon the completion of the process 604 results/checkpoint I/O 612 are generated.

Figure 6B:
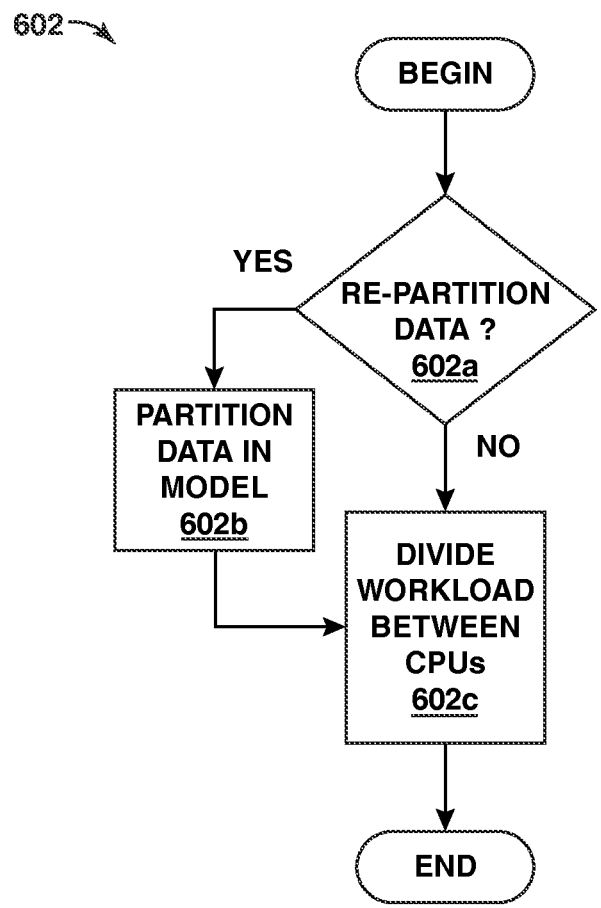

In an exemplary embodiment, as illustrated in FIG. 6b, the well management 602 determines if the data within the model 100 should be re-partitioned in 602a in order to improve the processing efficiency and/or accuracy of the well management. If the well management computational costs within the model 100 should be re-load balanced, then the data within the model is re-partitioned in 602b and the workload associated with the well management may be distributed among multiple CPUs or CPU cores in 602c.

Figure 6C:
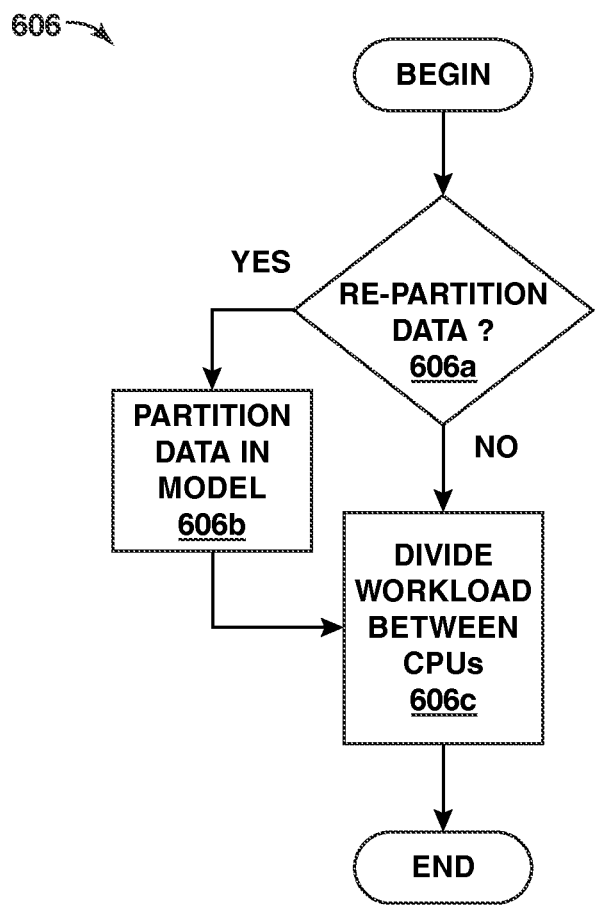

In an exemplary embodiment, as illustrated in FIG. 6c, the Jacobian construction and flow calculation 606 determines if the data within the model 100 should be re-partitioned in 606a in order to improve the processing efficiency and/or accuracy of the Jacobian construction and flow calculation. If the data within the model 100 should be re-partitioned, then the data within the model is re-partitioned in 606b and the workload associated with the Jacobian construction and flow calculation may be distributed among multiple CPUs or CPU cores in 606c.

Figure 6D:
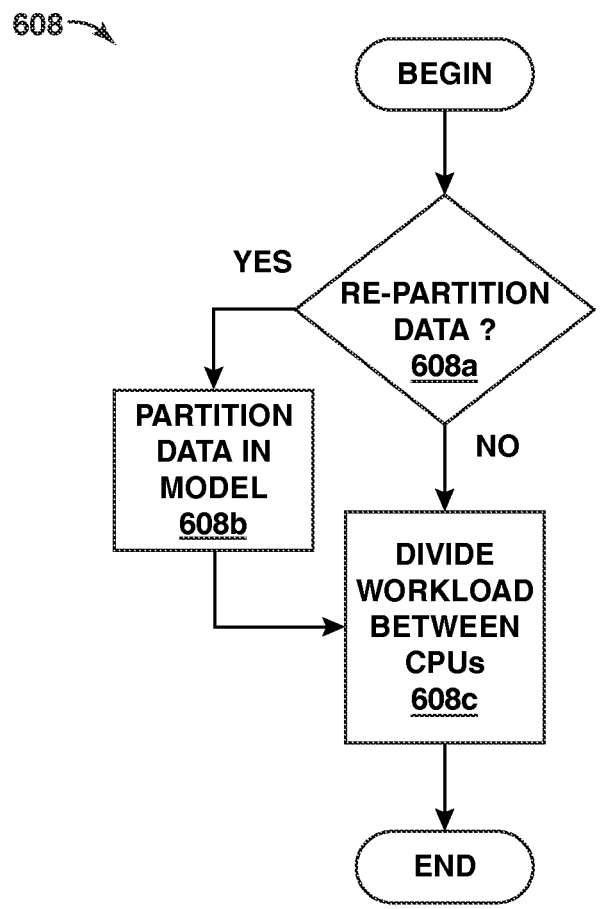

In an exemplary embodiment, as illustrated in FIG. 6d, the linear solve 608 determines if the data within the model 100 should be re-partitioned in 608a in order to improve the processing efficiency and/or accuracy of the linear solve. If the data within the model 100 should be re-partitioned, then the data within the model is re-partitioned in 608b and the workload associated with the linear solve may be distributed among multiple CPUs or CPU cores in 608d.

Figure 6E:
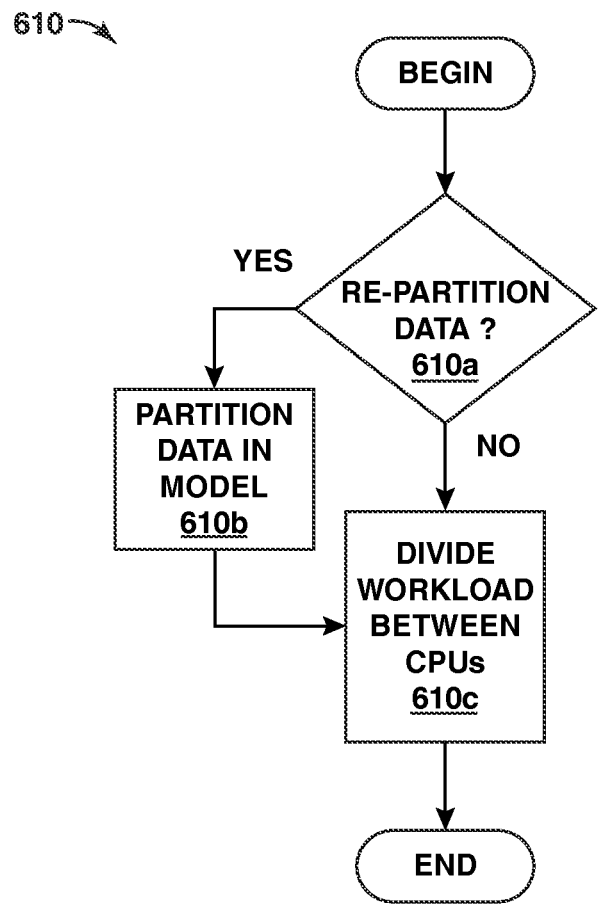

In an exemplary embodiment, as illustrated in FIG. 6e, the property calculations 610 determines if the data within the model 100 should be re-partitioned in 610a in order to improve the processing efficiency and/or accuracy of the property calculations. If the data within the model 100 should be re-partitioned, then the data within the model is re-partitioned in 610b and the workload associated with the linear property calculations may be distributed among multiple CPUs or CPU cores in 610c.

In an exemplary embodiment, the reservoir simulator 600 may be implemented, for example, using one or more general purpose computers, special purpose computers, analog processors, digital processors, central processing units, and/or distributed computing systems.

Figure 7:
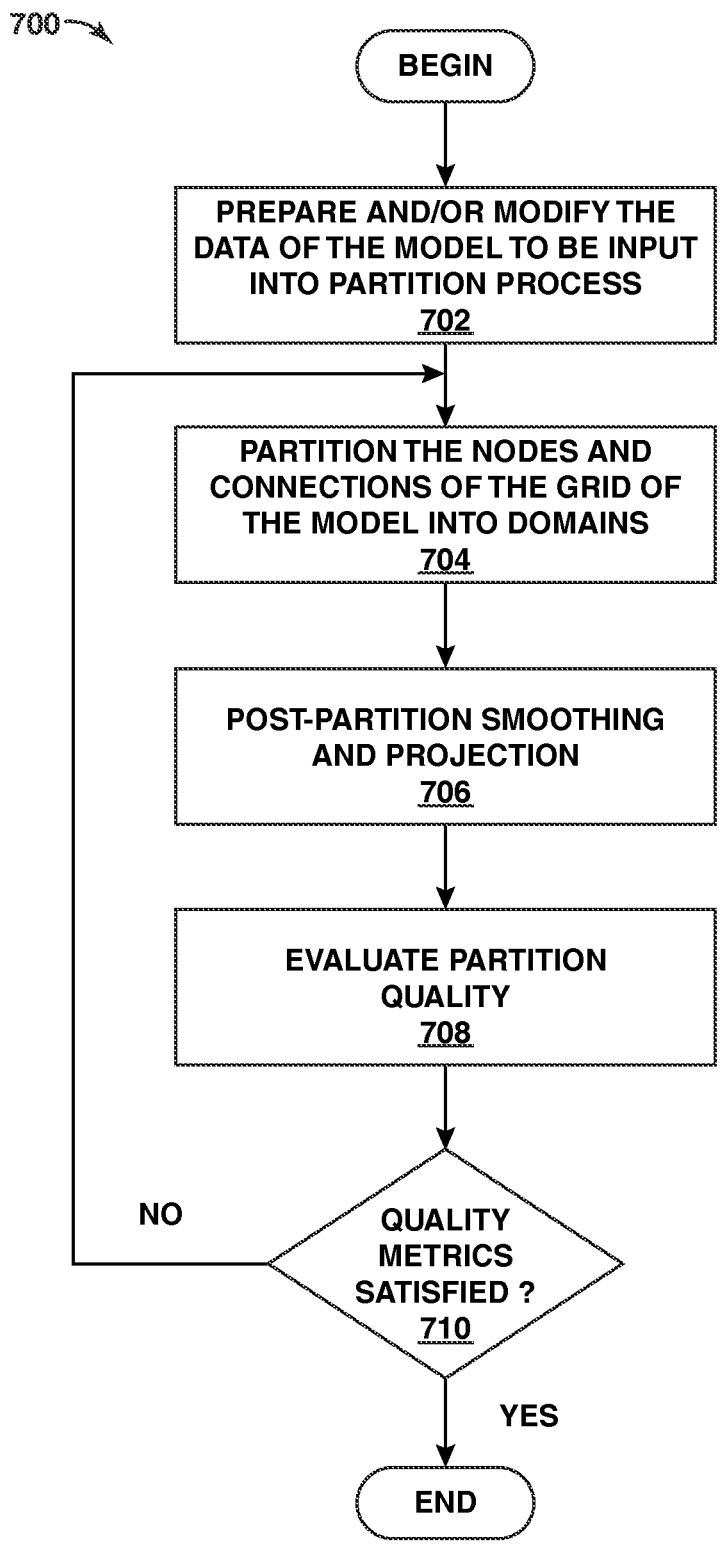
FIG. 7 is a flow chart illustration of the general method of partitioning any one of the calculation parts which constitute reservoir simulation process.

Referring to FIG. 7, one or more of the operational steps 602b, 606b, 608b, 610b and/or 612b described above with references to FIGS. 6a to 6e implement a method 700 of partitioning data within the reservoir model 100 in which the data within the model is prepared and/or modified for input into a partition process in 702. In an exemplary embodiment, preparing/modifying the data of the model 100 for input into the partition process in 702 includes one or more of determining/modifying the node and connection weights from the model and/or streamline tracing of the model, or preparing/ modifying the control parameters for any other partitioning algorithm. In 704, the prepared data of the model 100 is then partitioned 704 by partitioning the nodes and connections of the model in separate domains. In an exemplary embodiment, partitioning the nodes and connections of the model 100 in 704 includes partitioning the graph of the model. After completing the partitioning of the model 100, post-partition smoothing and projection is performed in 706. The quality of the partition of the model 100 is then determined in 708 using one or more quality metrics. If the quality metrics of the partition of the model 100 indicate a computationally inefficient data partition, then the method repeats steps 702 to 710 until the quality metrics of the partition of the model 100 are satisfied in 710.

Figure 8:
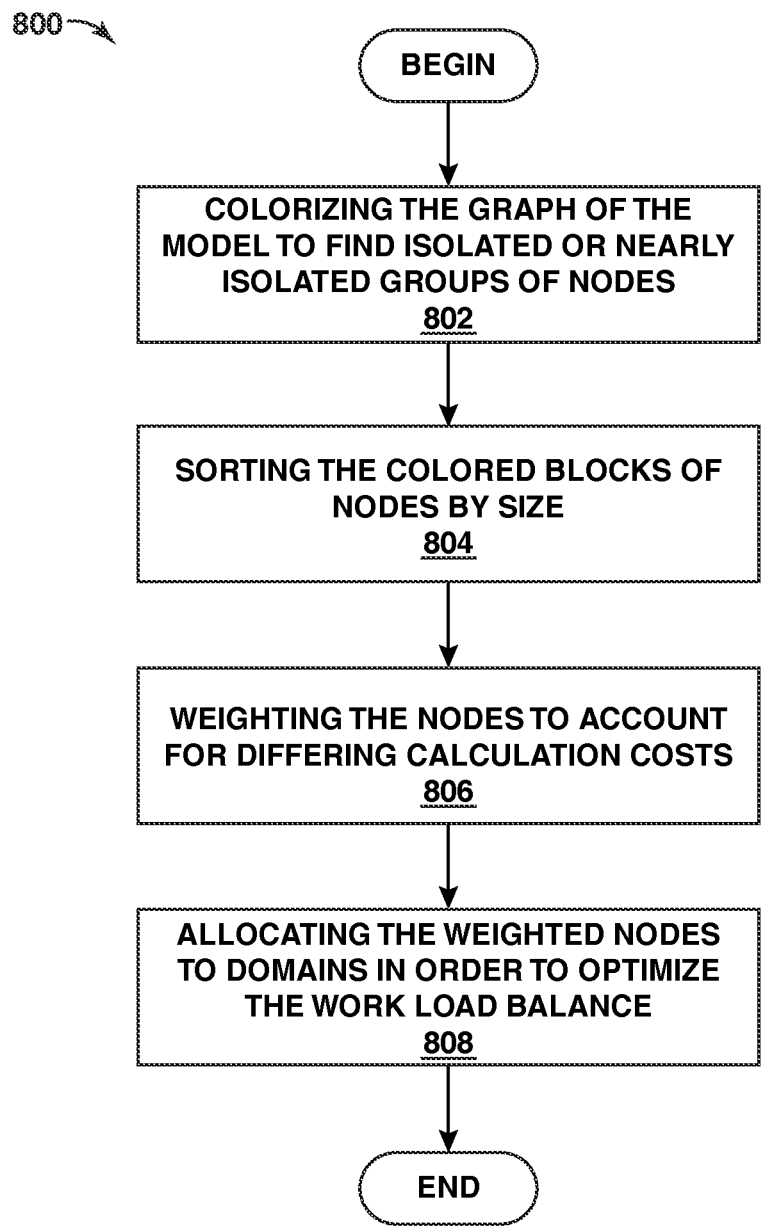
FIG. 8 is a flow chart illustration of a node coloring method of partitioning a reservoir model.
Figure 8A:
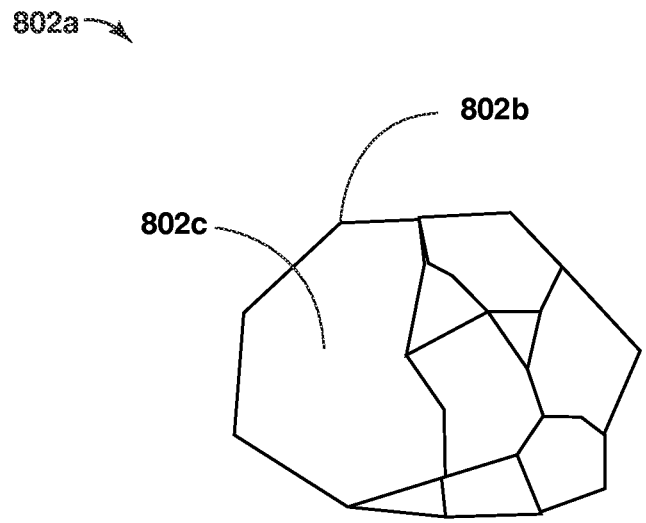
FIGS. 8a to 8d are schematic illustrations of various operational steps of the node coloring method of FIG. 8.

In an exemplary embodiment, as illustrated in FIG. 8, a method 800 of partitioning the model 100 includes colorizing the graph of the model in 802 in order to find isolated or nearly isolated groups of nodes. For example, as illustrated in FIG. 8a, a reservoir model 802a includes a plurality of nodes 802b that define one or more blocks 802c of associated nodes. In an exemplary embodiment, in 802, each of the blocks 802c of the model 802a are colorized in order to find isolated or nearly isolated groups of nodes. In an exemplary embodiment, the colorizing of the blocks 802c in 802 is indicative of the level of computational activity required to simulate the operation of the model 100 within the particular block. In an exemplary embodiment, in 802, the colorization of the blocks 802c is provided using a colorizing scheme in which certain colors are reflective of transmissibility, or some other equivalent or similar measure of conductivity such as, for example, Jacobian pressure equation off-diagonal, that is indicative of an isolated or nearly isolated region of the model 100.

Figure 8B:
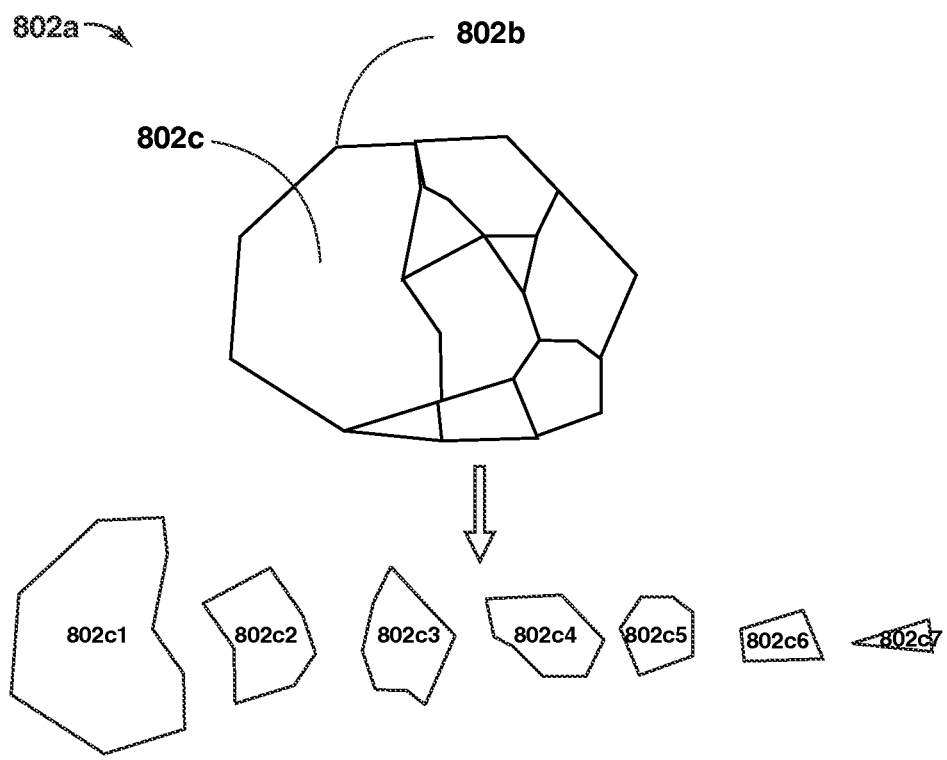

In an exemplary embodiment, the method 800 then sorts the colored blocks of nodes by size in 804. For example, as illustrated in FIG. 8b, the colorized blocks 802c are sorted left to right by size in 804 and identified as blocks 802c1, 802c2, 802c3, 802c4, 802c5, 802c6, and 802c7, respectively.

Figure 8C:
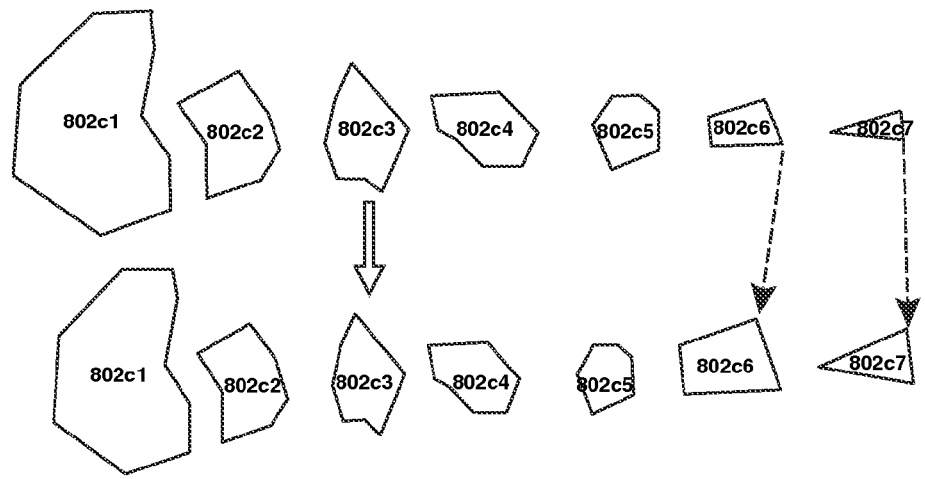

In an exemplary embodiment, the method 800 then weights the nodes of each of the colorized and sorted blocks in 806 to account for differing calculation costs associated with processing the respective nodes during the simulation of the model 100. For example, as illustrated in FIG. 8c, in 806, the nodes of the colorized blocks 802c are weighted as a function of the associated processing costs associated with processing the respective nodes during the simulation of the model 100.

Figure 8D:
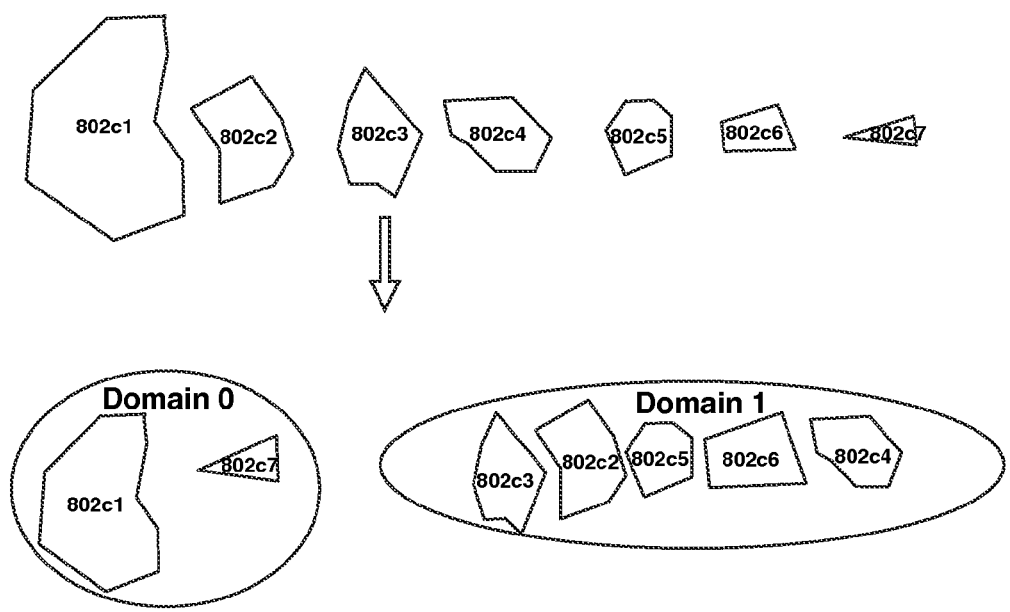

In an exemplary embodiment, the method 800 then allocates the weighted nodes to domains in order to optimize the work load balance in 808. For example, as illustrated in FIG. 8d, in 808, the method allocated blocks 802c1 and 802c7 to domain 0 and blocks 802c2, 802c3, 802c4, 802c5 and 802c6 to domain 1.

Figure 9:
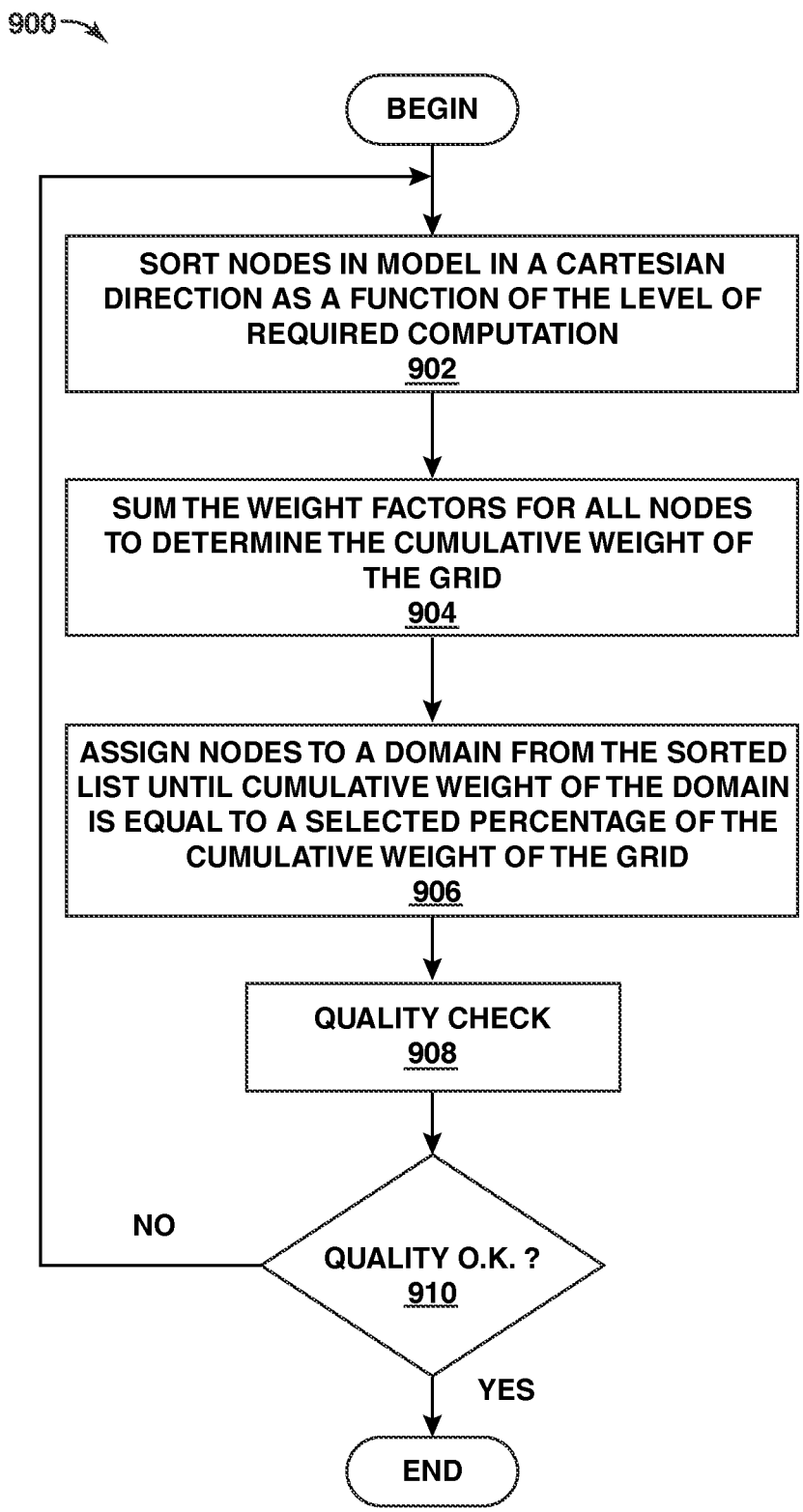
FIG. 9 is a flow chart illustration of a load balanced, geometric method of partitioning a reservoir model.
Figure 9A:
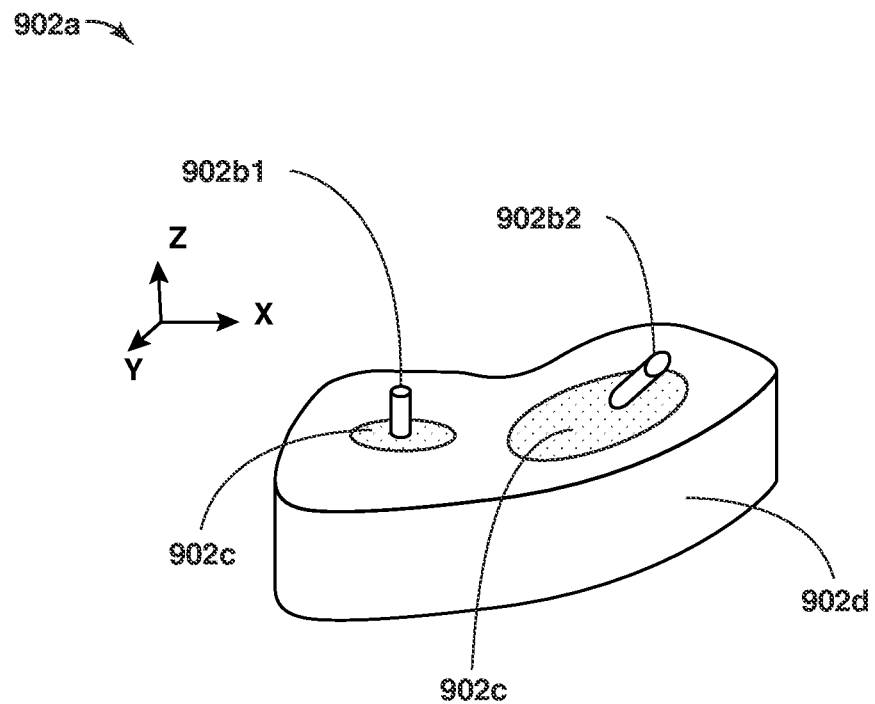
FIGS. 9a to 9e are schematic illustrations of various operational steps of the load balanced, geometric method of FIG. 9.
Figure 9B:
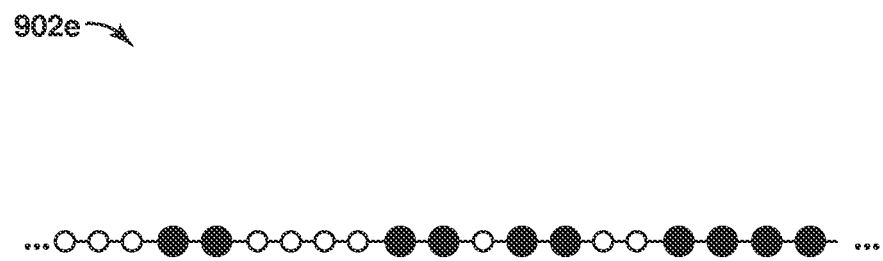

In an exemplary embodiment, as illustrated in FIG. 9, a method 900 of partitioning the model 100 includes sorting the nodes within the model in a Cartesian direction as a function of the level of required computation for each node in 902. For example, as illustrated in FIG. 9a, a reservoir model 902a includes wells 902b, regions 902c that are more computationally expensive and regions 902d that are less computationally expensive. As illustrated in FIG. 9b, the nodes 902e in the model 902a are sorted in a given Cartesian direction as a function of the level of computation associated with each node in 902.

In an exemplary embodiment, the method 900 then sums the computational weight factors for all of the nodes 902e to determine the cumulative computation weight of the grid for the model 902a in 904.

Figure 9C:
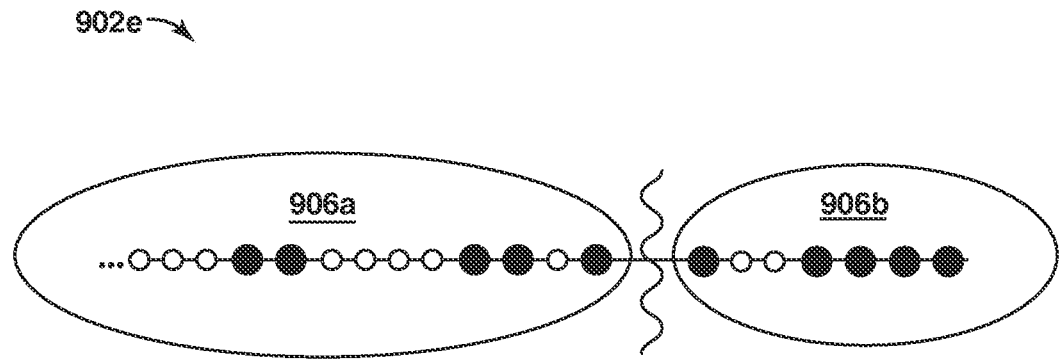

In an exemplary embodiment, the method 900 then assigns nodes 902e to a particular domain until the cumulative computation weight for the particular domain is equal to a predetermined percentage of the cumulative computational weight of the grid in 906. For example, as illustrated in FIG. 9c, in an exemplary embodiment, in 906, the nodes 902e within the model 902a are assigned to domains 906a and 906b.

Figure 9D:
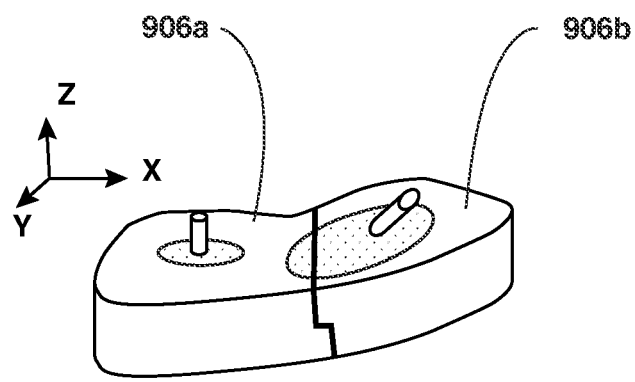
Figure 9E:
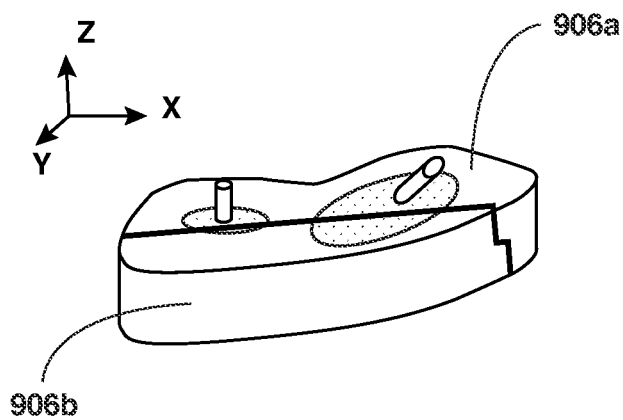

In an exemplary embodiment, as illustrated in FIG. 9d, if the sorting of the nodes 902e in the method 900 is performed in the X-direction, then the resulting domains 906a and 906b are generated. Alternatively, in an exemplary embodiment, as illustrated in FIG. 9e, if the sorting of the nodes 902e in the method 900 is performed in the Y-direction, then the resulting domains 906a and 906b are generated.

In an exemplary embodiment, the method 900 then performs a quality check in 908 and 910 to determine if the partition selected in 906 is adequate according to predetermined quality control criteria.

In several exemplary embodiments, the sorting of the nodes 902e in the method 900 may be provided using any direction such as, for example, x, y, or z. And, in an exemplary embodiment, the directions chosen and partition of domains selected may be an iterative process that optimizes the even distribution of the processing of the model 902a.

Figure 10:
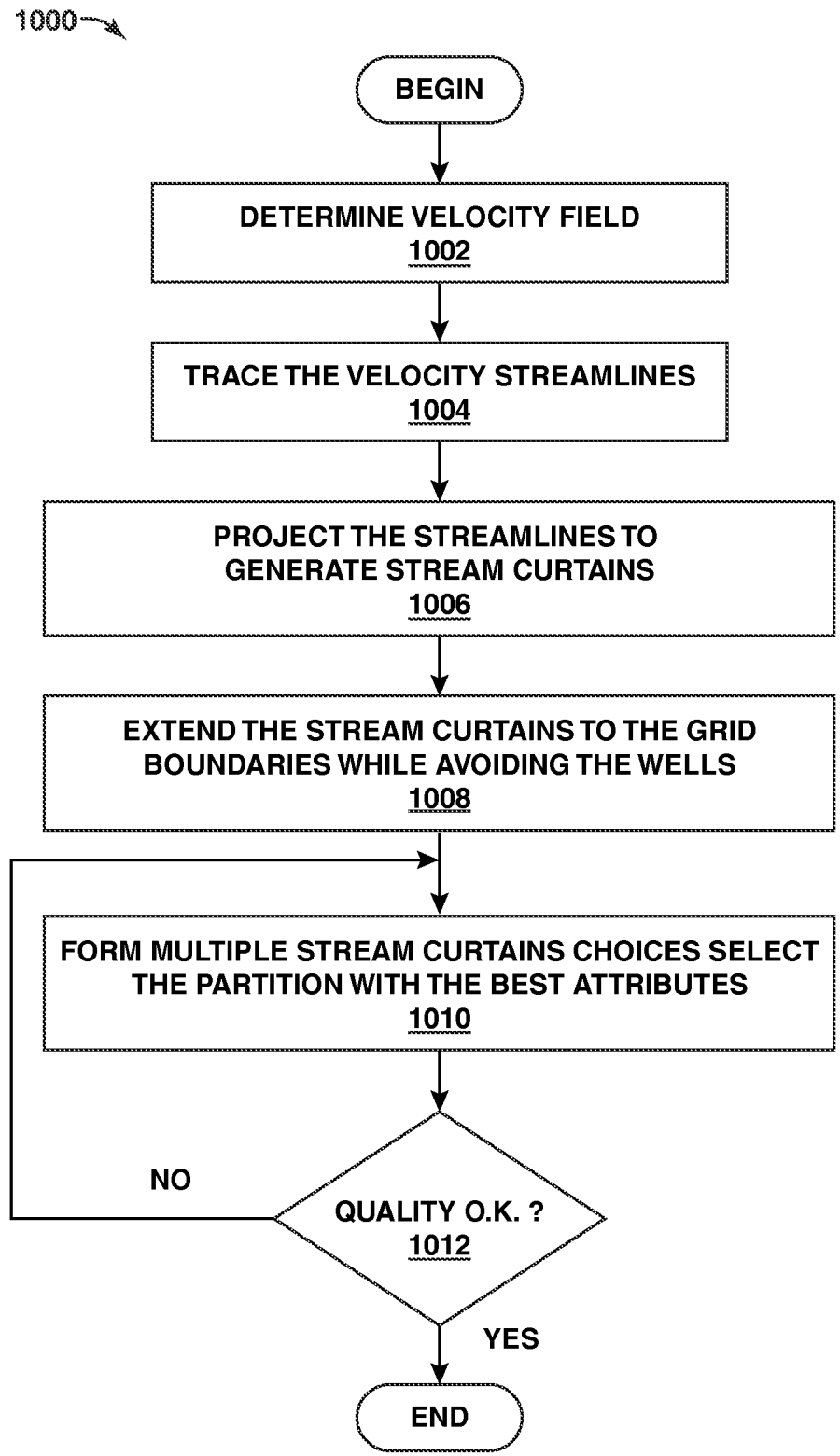
FIG. 10 is a flow chart illustration of a streamline method of partitioning a reservoir model.
Figure 10A:
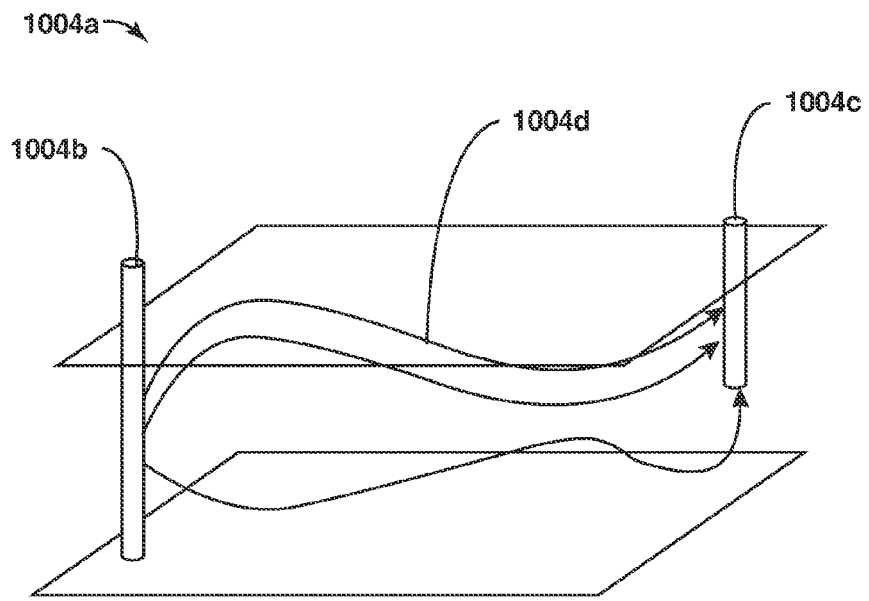
FIGS. 10a to 10c are schematic illustrations of various operational steps of the streamline method of FIG. 10.

In an exemplary embodiment, as illustrated in FIG. 10, a method 1000 of partitioning the model 100 includes determining the velocity field for the model in 1002. The method 1000 then traces the velocity streamlines based upon the determined velocity field for the model 100 in 1004. For example, as illustrated in FIG. 10a, a reservoir model 1004a includes wells, 1004b and 1004c, and streamlines 1004d that extend between the wells.

Figure 10B:
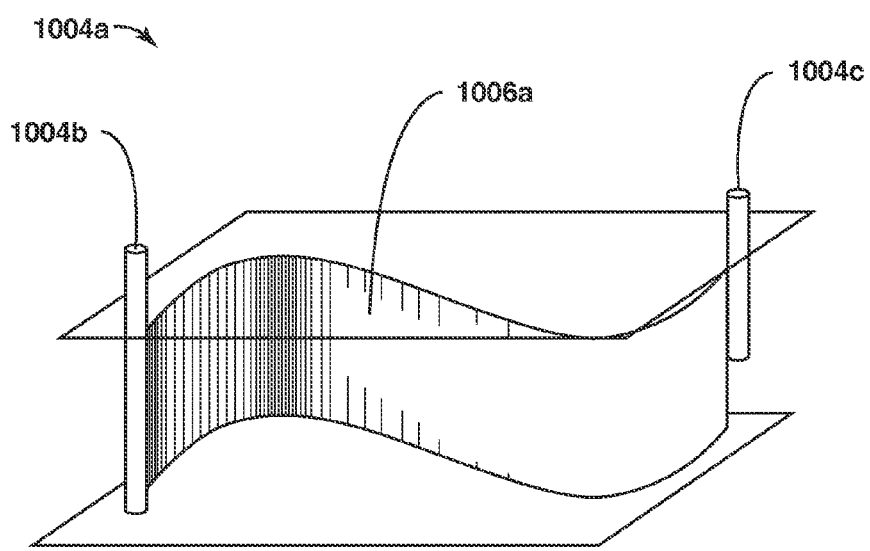

In an exemplary embodiment, the method 1000 then projects the streamlines up and down in the vertical direction to generate a stream curtain in 1006. For example, as illustrated in FIG. 10b, in 1006, the streamlines 1004d are projected up and down to generate a stream curtain 1006a.

Figure 10C:
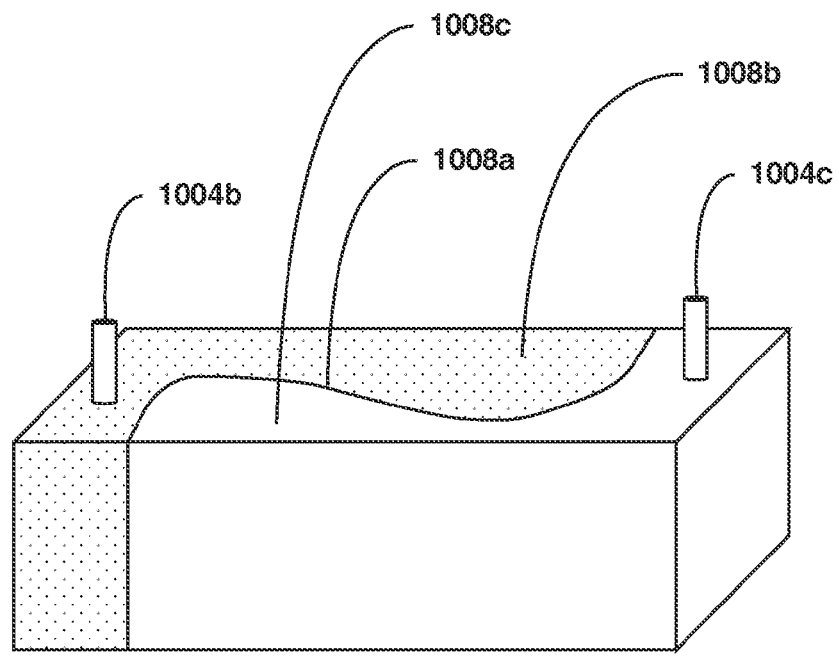

In an exemplary embodiment, the method 1000 then extends the streamline curtains to the boundaries of the grid of the model while adjusting the streamline curtains to avoid the wells in 1008. For example, as illustrated in FIG. 10c, in 1008, the streamline curtain 1006a is adjusted to generate a streamline curtain 1008a that extends to the boundaries of the grid of the model 1004a while avoiding the wells, 1004b and 1004c. As a result, the model 1004a is partitioned into domains, 1008b and 1008c.

In an exemplary embodiment, the method 1000 then selects the best partition of the model 100 using a plurality of streamline curtains in 1010.

In an exemplary embodiment, the method 1000 then performs a quality check in 1012 to determine if the partition selected in 1010 is adequate according to predetermined quality control criteria. If the partition selected in 1010 is not adequate according to the predetermined quality control criteria, the method continues to iteratively modify the partition until it is adequate.

In an exemplary embodiment, the use of the method 1000 to partition the model 100 minimizes the processing cost of simulating the model using the simulator 600. In particular, in an exemplary embodiment, since the velocity streamlines may approximate the dynamic flow of fluids within the model 100, the streamlines therefore represent boundaries over which the influence of the jump in the material properties may be minimized.

Figure 11:
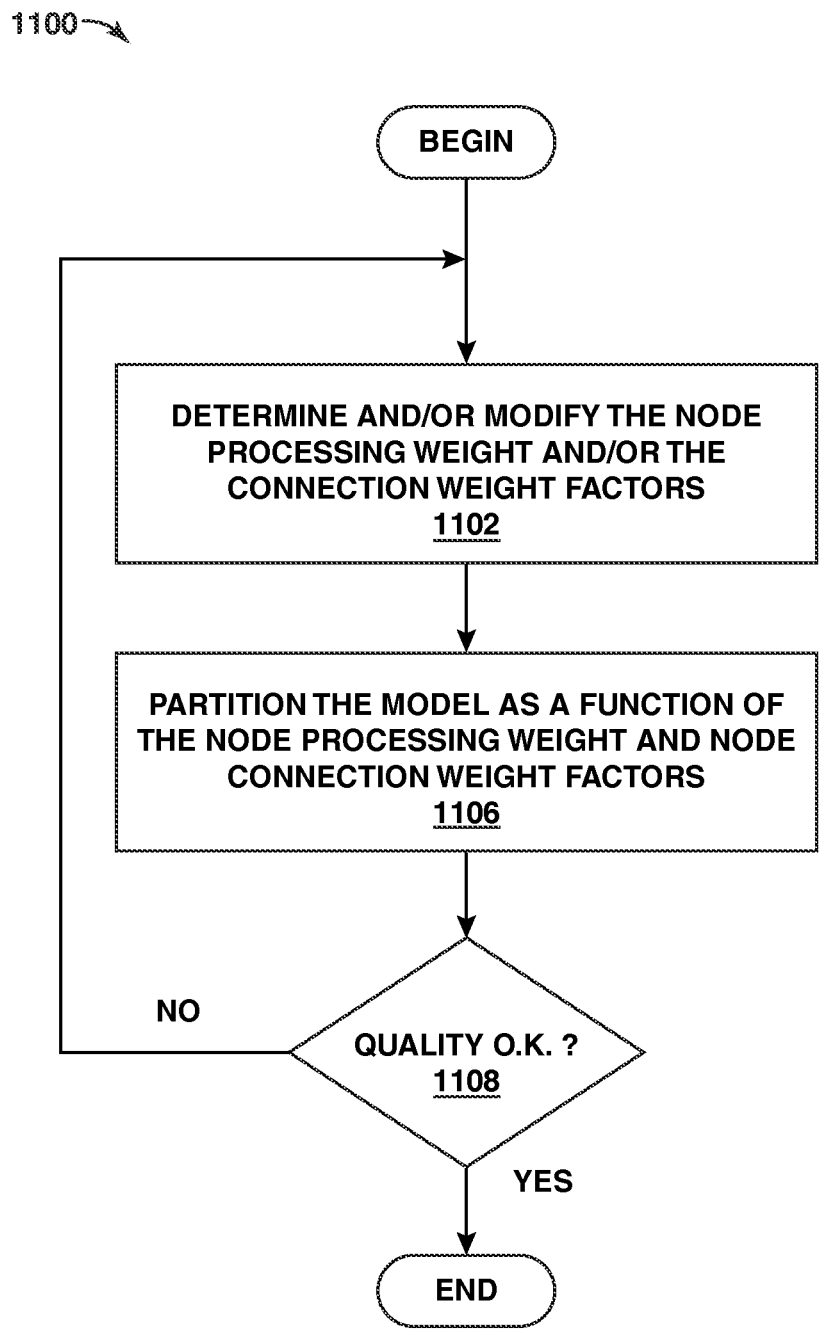
FIG. 11 is a flow chart illustration of a distance-to-well method of partitioning a reservoir model.

In an exemplary embodiment, as illustrated in FIG. 11, a method 1100 of partitioning the model 100 determines the node and connection weight factors in 1102, or modifies them if necessary. In an exemplary embodiment, the node weight factors are representative of the processing cost associated with a node in the model 100 and the connection weight factors are representative of the degree to which nodes are connected to other nodes.

In an exemplary embodiment, the method 1100 then partitions the model 100 in 1106 as a function of the node weight and node connection weight factors determined in 1102. In an exemplary embodiment, in 1106, the model 100 is partitioned to evenly distribute the processing cost of simulating the model amongst a plurality of domains. In an exemplary embodiment, the domains of the model 100 constructed in 1106 avoid cutting connections between strongly connected nodes in the model.

In an exemplary embodiment, the method 1100 then performs a quality check in 1108 to determine if the partition selected in 1106 is adequate according to predetermined quality control criteria.

In an exemplary embodiment, the determination of the node weight factors and/or the connection weight factors in 1102 are time variable.

Figure 12:
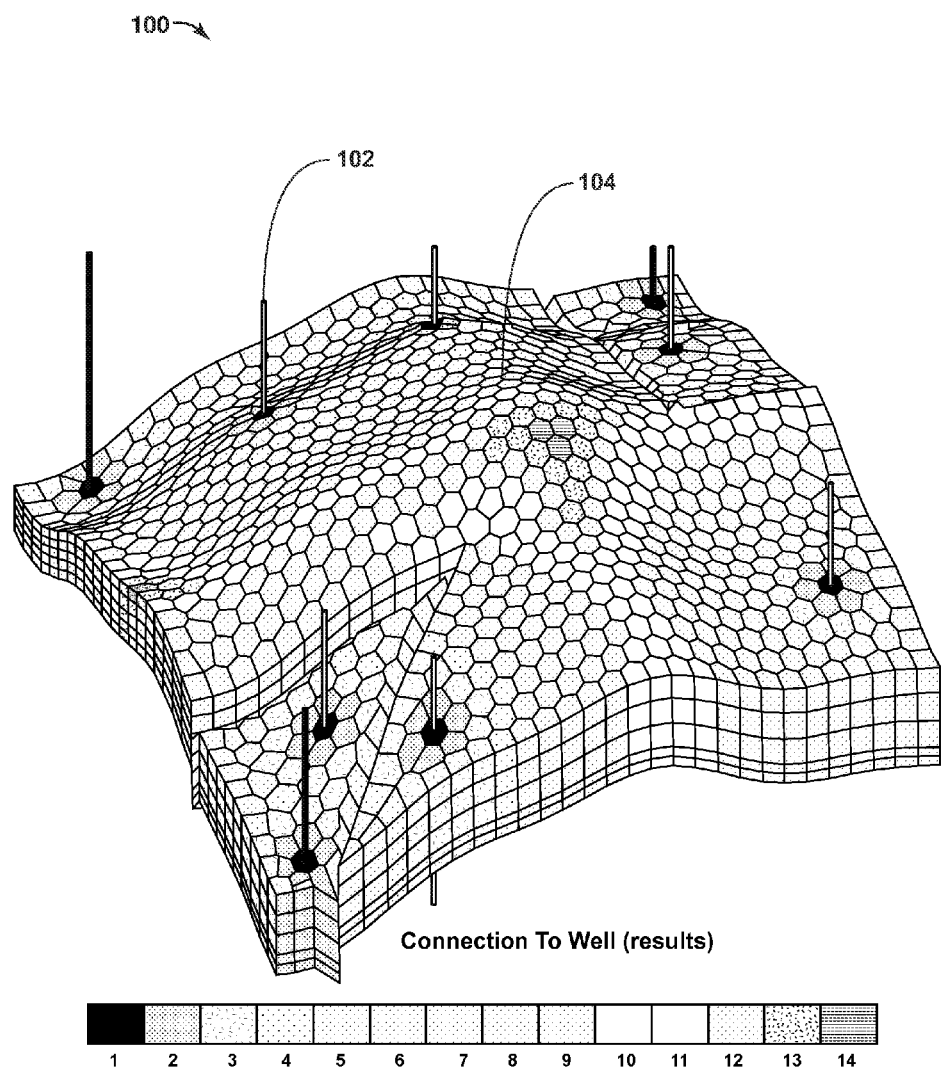
FIG. 12 is an illustration of the weighting of the nodes of a reservoir model as a function of their distance from wells.

In an exemplary embodiment, the determination of the connection weight factors in 1102 may be implemented by determining the distance of a node from the nearest well. For example, as illustrated in FIG. 12, the nodes within the model 100 may be color coded to indicate their respective distances from their respective closest wells 102. The distance of a node 104 from the nearest well may then be used as part of the determination of the connection weight in 1102. In an exemplary embodiment, the closer a node 104 is to a well 102, the higher the connection weight and hence the less desirable breaking this connection between the node and the closest well during the partitioning of the model 100 in 1106 of the method 1100.

Figure 13:
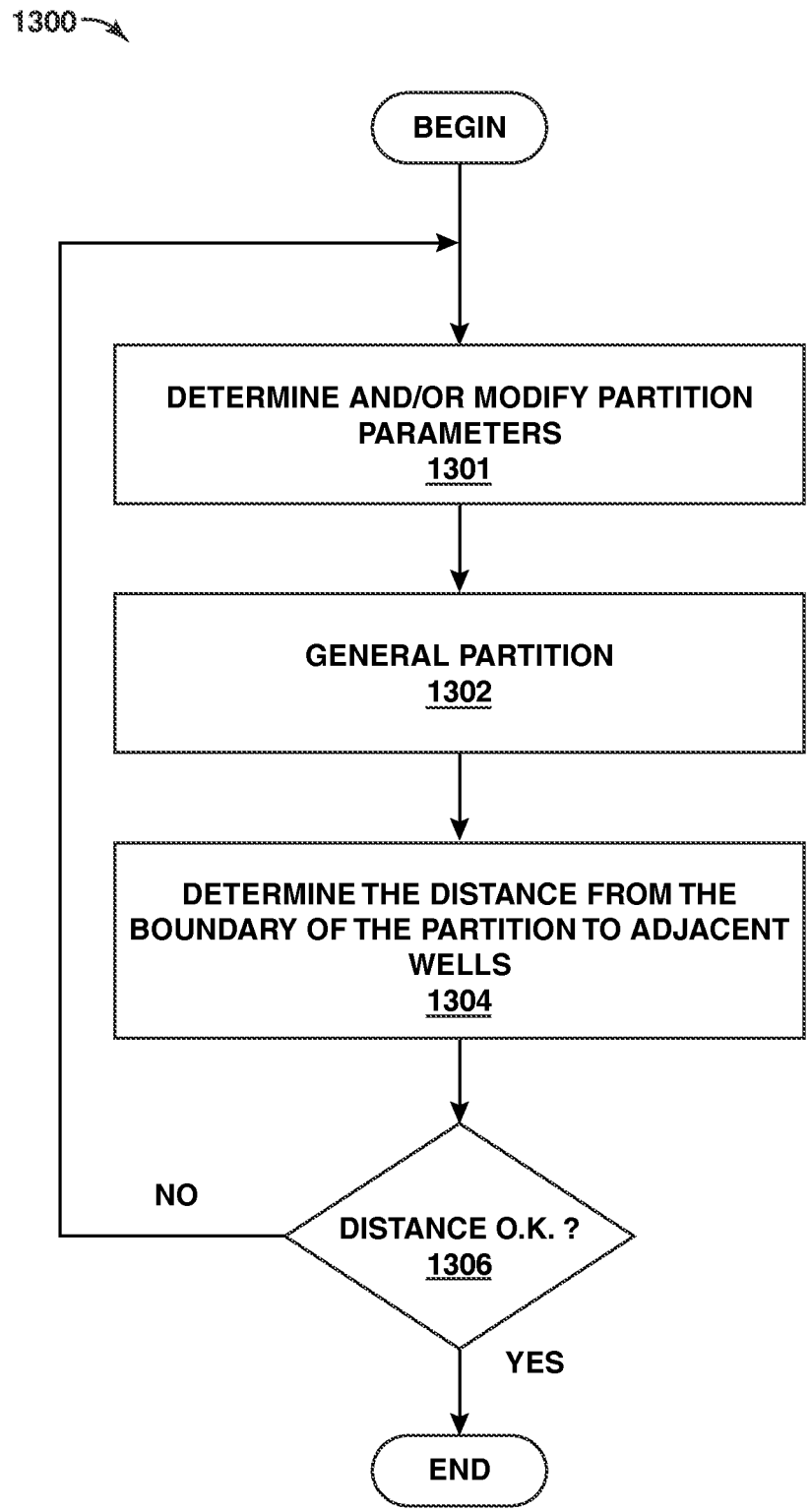
FIG. 13 is a flow chart illustration of a method of partitioning a reservoir model.

In an exemplary embodiment, as illustrated in FIG. 13, a method 1300 of partitioning the model 100 determines or modifies the partition parameters in 1301 and generates a partition of the model 100 in 1302. In an exemplary embodiment, the method 1300 then determines the distance from the boundaries of the generated partition to adjacent wells 102 in the model 100 in 1304. If the distance from any of the boundaries of the generated partition is less than some predetermined value in 1306, then 1301 to 1306 are repeated until the distance from all of the boundaries of the generated partition is greater than or equal to some predetermined value.

Figure 14:
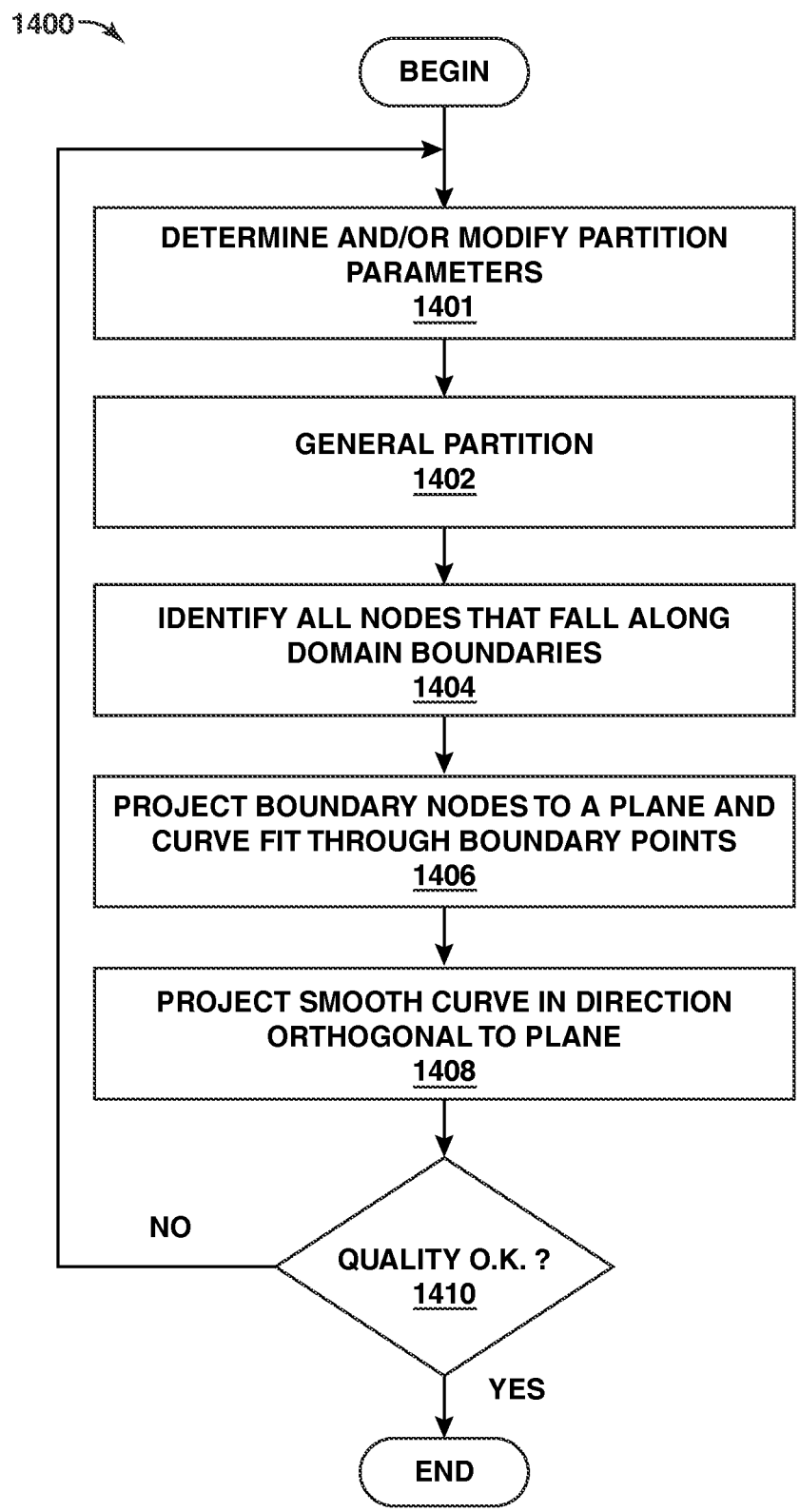
FIG. 14 is a flow chart illustration of a curve fit method of smoothing the partition of a reservoir model.
Figure 14A:
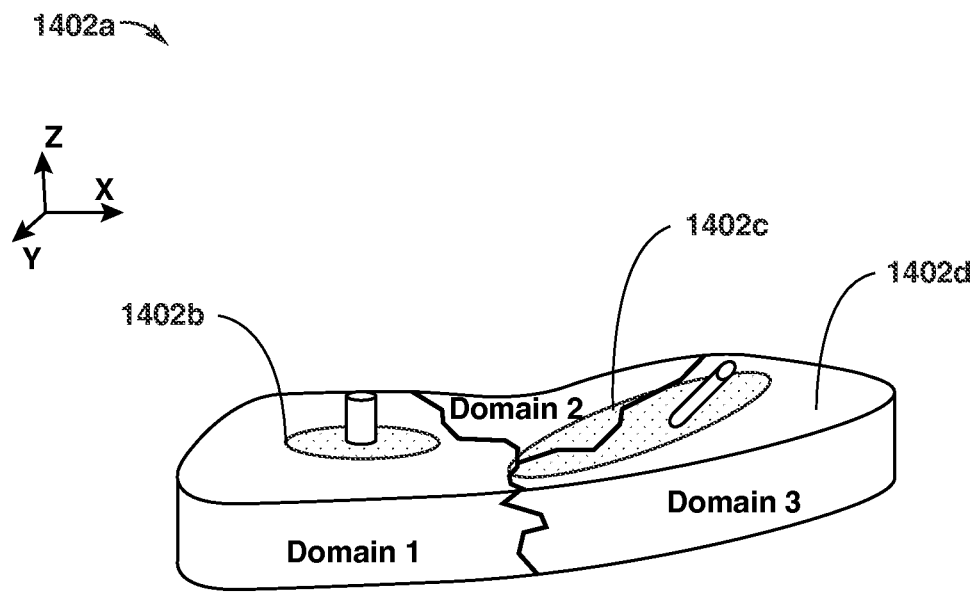
FIGS. 14a to 14d are schematic illustrations of various operational steps of the curve fit smoothing method of FIG. 14.

In an exemplary embodiment, as illustrated in FIG. 14, a method 1400 of partitioning the model 100, determines the partition parameters or if necessary modifies them in 1401 and generates a partition in 1402. In an exemplary embodiment, as illustrated in FIG. 14a, in 1402, the method 1400 partitions a model 1402a into domains, 1402b, 1402c, and 1402d.

Figure 14B:
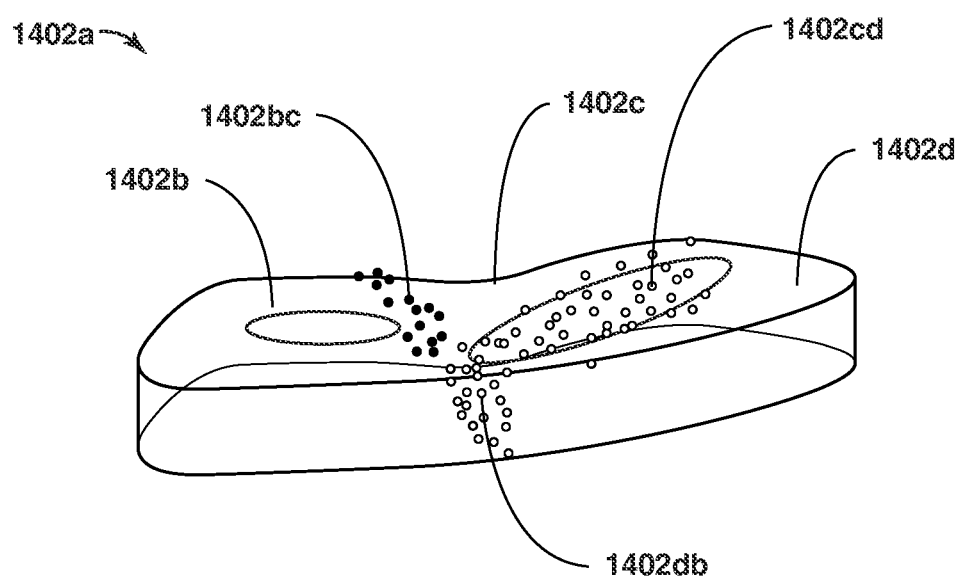

In an exemplary embodiment, the method 1400 then determines all nodes that fall along the boundaries between the domains of the partitioned model in 1404. In an exemplary embodiment, as illustrated in FIG. 14b, in 1404, the method 1400 determines that the nodes 1402bc fall along the boundary between the domains 1402b and 1402c, the nodes 1402cd fall along the boundary between the domains 1402c and 1402d, and the nodes 1402db fall along the boundary between the domains 1402d and 1402b.

Figure 14C:
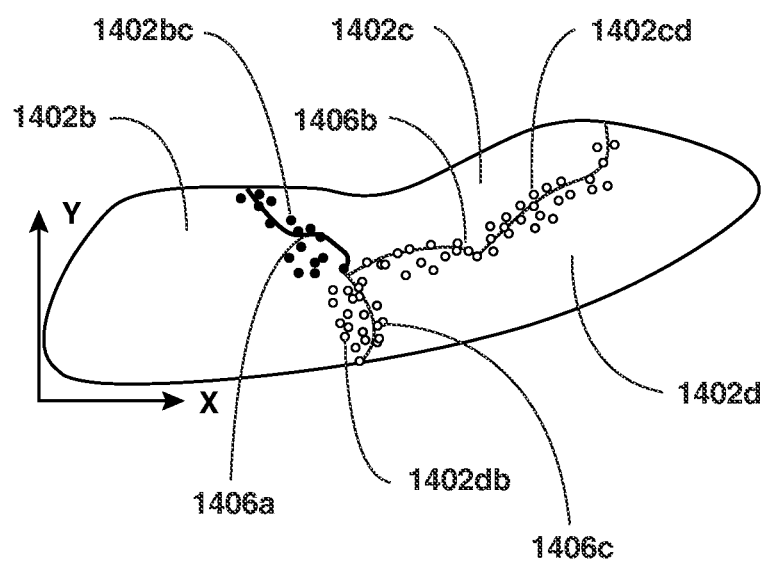

In an exemplary embodiment, the method 1400 then projects the boundary nodes to a plane and fits a curve through the projected boundary nodes in 1406. In an exemplary embodiment, as illustrated in FIG. 14c, in 1406, the method 1400 projects the boundary nodes, 1402bc, 1402cd, and 1402db, to the X-Y plane and fits curves, 1406a, 1406b, and 1406c, respectively, through the projected boundary nodes in 1406.

Figure 14D:
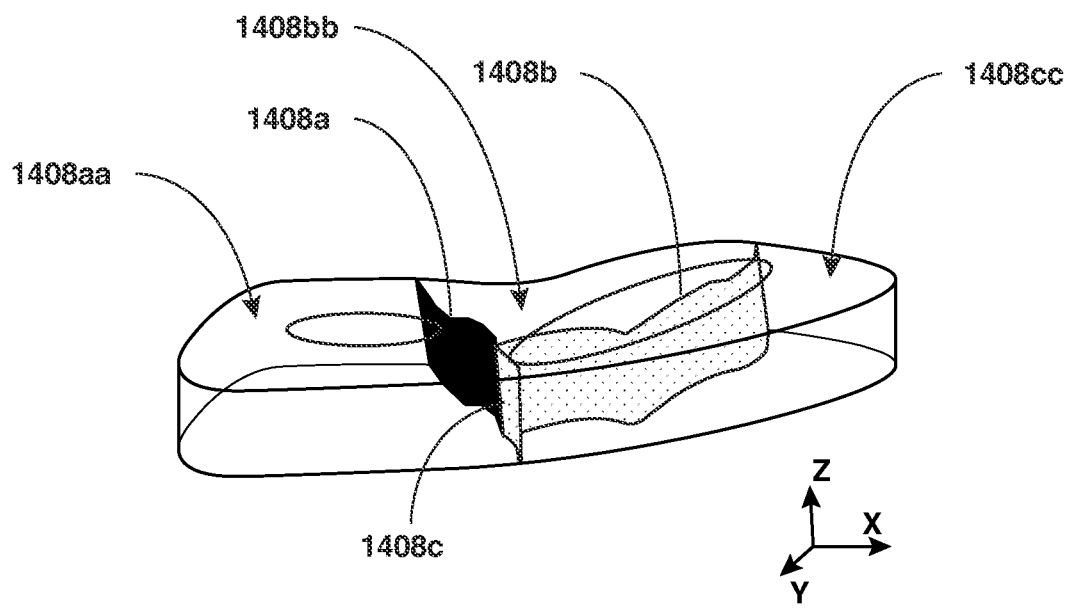

In an exemplary embodiment, the method 1400 then projects smooth surface in another direction extending from the curves generated in 1408, which may, for example, be orthogonal to the plane selected in 1408, In an exemplary embodiment, as illustrated in FIG. 14d, the method projects smooth curves, 1408a, 1408b, and 1408c, in the Z-direction. As a result, the model 1402a is portioned into domains 1408aa, 1408bb, and 1408cc.

In an exemplary embodiment, the method 1400 then determines if the quality of the partition of the model 1402a into separate domains is of sufficient quality in 1410.

Figure 15:
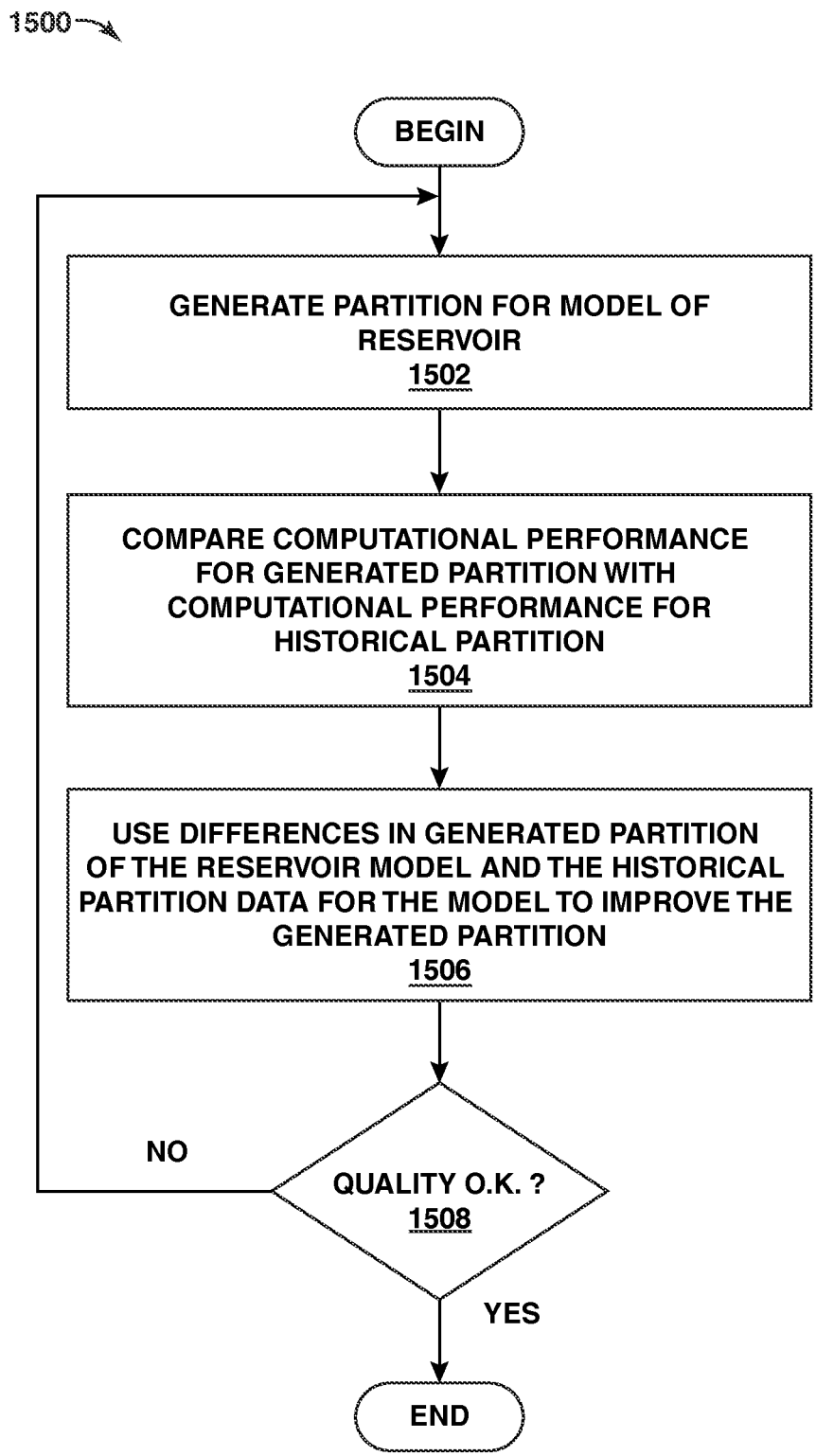
FIG. 15 is a flow chart illustration of a historical comparison method of partitioning a reservoir model.

Referring to FIG. 15, an exemplary embodiment of a method 1500 of partitioning a reservoir model generates a partition of the reservoir model in 1502. In an exemplary embodiment, the method 1500 then compares the computational performance for the generated partition of the reservoir model with the computational performance of historical data regarding the partition of the reservoir model in 1504. In an exemplary embodiment, the method 1500 then iteratively uses the differences in the computational performance for the generated partition of the reservoir model with the computational performance of the historical data for the partition of the reservoir model to improve the partition of the reservoir model in 1506. In an exemplary embodiment, the method 1500 then determines if the quality of the partition of the reservoir model into separate domains is of sufficient quality in 1508. If the quality is not good, a new partition method is attempted.

In an exemplary embodiment, in 1508, the method 1500 determines the quality of the partition of the reservoir model using one or more static measures of the quality of the partition which may, for example, include statistical measures of the domain boundary connections, the mean and standard deviation of the transmassabilities, the Jacobian off-diagonal elements, a measure of the smoothness of the domain boundaries within the partition. In an exemplary embodiment, a measure of the smoothness of the domain boundaries may, for example, be provided by projecting the boundary nodes of a particular interface between adjacent domains into a plane and then fitting a curve through the projection. In an exemplary embodiment, the degree to which the curve fits the projection provides an indication of the degree to which the boundary between the adjacent domains is heterogeneous.

In an exemplary embodiment, the partitioning of the nodes and connections of the grid of the model 100 into domains in the method 700 includes one or more aspects of the methods 800 and/or 900 and/or 1000 and/or 1100 and/or 1300 and/or 1400 and/or 1500 of partitioning.

In an exemplary embodiment, the operation of the simulator 600 and/or one or more of the methods 600, 700, 800, 900, 1000, 1100, 1300, 1400 and/or 1500 are further implemented to optimize the processing efficiency of the simulation of the reservoir 100 using one or more of the following metrics of performance: 1) solver iterative convergence rate; 2) wall clock time to CPU ratio; 3) properties calculation; and/or 4) Jacobian construction and flow calculations.

In an exemplary embodiment, the total number of outer iterations of the linear iterative solver are a good indicator of parallel efficiency and partition problems.

In an exemplary embodiment, during serial processing of the simulator 600, the amount of time a CPU spends on a calculation should be equal to the amount of time which passed—i.e., the wall clock time. In an exemplary embodiment, during parallel processing of the simulator 600, the total processing work performed by the all of the CPU's working on the simulation should ideally remain the same as the serial run except that the elapsed wall clock time should drop and the ratio of the wall clock time to the number of CPUs—the wall clock time to CPU ratio—should be proportional to 1/(Number of CPU's). However, the wall clock time-to-CPU ratio should also drop if the CPU rate increases faster than the wall clock time. For example, this might happen if the parallel processing is working much more inefficiently than the serial version. The ratio of the wall clock time to CPU time is a useful, dynamic measure of parallel efficiency if used in conjunction with other measures. For example, a change in the wall time-to-CPU ratio as the simulation progresses is an indication of a problem. In an exemplary embodiment, similar reservoir simulation models may be expected to run similarly. And in particular, the parallel performance of a simulation of a reservoir model may be expected to be similar for similar physical reservoir models. Thus, we may compare the current wall time to CPU time to that of similar reservoir models and infer parallel efficiency.

In an exemplary embodiment, one or more of the methods of partitioning the reservoir model 100 into separate domains described above with reference to FIGS. 1-15 are implemented in a dynamic fashion in order to at least minimize time-dependent degradation of the efficiency of parallel processing of a reservoir simulator.

In an exemplary embodiment, the load balance of the simulation of a reservoir model may be inferred through other measures of the workload of the CPUs. In particular, different categories of calculations performed during a simulation of a reservoir model have different useful measures for the cost of a calculation per grid node.

In an exemplary embodiment, the equation-of-state (EOS) properties calculations, which are usually calculated one node at a time during the simulation of a reservoir model, produces a measure of worked performed during the flash calculation. The flash calculation is the process to determine fluid volumes and compositions based on input pressure and components. This measure may come in the form of flash solver iteration count—as distinct from the linear matrix equation solver for the entire system. In an exemplary embodiment, another measure of the cost of the flash is the complexity of the fluid—how many phases and components of fluid exist at a node at an instant in time. This has the added benefit of having applicability for both EOS and Black oil (BO) fluid models.

In an exemplary embodiment, the cost of the Jacobian Construction & flow calculations, typically vector-vector and matrix-vector operations, may be measured by the number of components and phases by which the fluid is modeled and the level of implicitness used for the mathematical discretization. In an exemplary embodiment, the more phases and components that are used to model a fluid, the more state variables must be calculated. In an exemplary embodiment, the more implicitly that one models the properties at a given node, the more expensive are the calculations for that node. The more implicit calculations require more derivative calculations.

Figure 16:
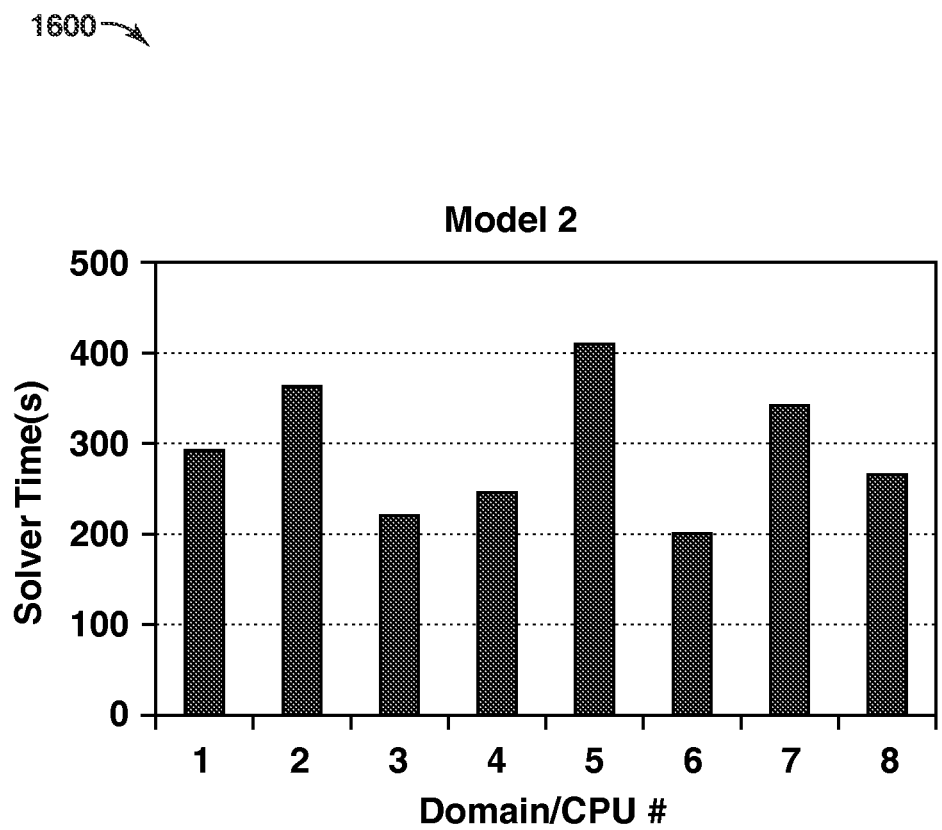
FIG. 16 is a graphical illustration of the evaluation of the individual domain performance of a linear solve in a simulation of a reservoir model.

In an exemplary embodiment, as illustrated in FIG. 16, the operational efficiency of a parallel processing of the linear solve of a reservoir simulator may be evaluated by examining the solver time 1600 for each of the CPUs associated with the linear solve.

In an exemplary embodiment, a framework for using partitioning algorithms to optimize parallel performance of a reservoir simulator comprises: a) adjusting the parameters for a given partitioning algorithm—e.g. calculating node and connection weight factors for a graph partition algorithm (GPA); b) running a partitioning method of choice, for example, a GPA; c) doing post processing improvements—fix-up and smoothing of the partition; d) evaluating the quality of the partition; and e) if the quality is acceptable exit, else repeat the process with properly changed parameters of the GPA.

In an exemplary embodiment, each category of calculation performed during the operation of the simulator 600 may benefit from its own, targeted partitioning method and have designed the partitioning scheme to specialize for each calculation category.

In an exemplary embodiment, because physical and mathematical properties of a reservoir simulation are typically time dependent, the partitioning methods described herein are independently adaptive—that is, the partitioning scheme for each calculation category performed during the operation of the simulator 600 may be adapted with its own targeted frequency.

In an exemplary embodiment, the partitioning methods described herein employ physically based metrics to determine the quality of the partitions.

In an exemplary embodiment, the partitioning of the model 100 includes geometric cutting of the model; coloring with the sorting of the nodes of the model—based on physical weighting of nodes and connections with physically based thresholds on communication across connections; and flow based partitioning. In an exemplary embodiment, the flow based partitioning includes streamline based such as, for example, stream line curtain, stream tube agglomeration, and smoothing; and graph partitioning with flow or coefficient based weightings to minimize large jumps in coefficients across domain boundaries.

A method of simulating a reservoir model has been described that includes generating the reservoir model; partitioning the generated reservoir model into a plurality of domains; and simulating the partitioned reservoir model. In an exemplary embodiment, simulating the reservoir model includes dividing the simulating of the reservoir into a plurality of processing elements; and processing a plurality of the processing elements in parallel. In an exemplary embodiment, processing the plurality of the processing elements in parallel includes re-partitioning the generated reservoir model into a plurality of domains. In an exemplary embodiment, re-partitioning the generated reservoir model into a plurality of domains includes a) pre-processing the reservoir model which can include but is not limited to choosing/changing the partitioning algorithm and determining/modifying the parameters for the already chosen partitioning algorithm; b) partitioning the generated reservoir model into a plurality of domains; c) post-processing the partitioned reservoir model to correct the partitioned reservoir model; d) evaluating a quality of the post-processed partitioned reservoir model; and e) if the quality of the post-processed partitioned reservoir model is less than a predetermined value, then repeating a, b, c, d and e. In an exemplary embodiment, simulating the reservoir model includes re-partitioning the reservoir model; dividing the simulating of the reservoir into a plurality of processing elements; and processing a plurality of the processing elements in parallel. In an exemplary embodiment, partitioning the generated reservoir model into a plurality of domains includes a) pre-processing the reservoir model which can include but is not limited to choosing/changing the partitioning algorithm and determining/modifying the parameters for the already chosen partitioning algorithm; b) partitioning the generated reservoir model into a plurality of domains; c) post-processing the partitioned reservoir model to correct the partitioned reservoir model; d)

evaluating a quality of the post-processed partitioned reservoir model; and e) if the quality of the post-process partitioned reservoir model is less than a predetermined value, then repeating a, b, c, d and e. In an exemplary embodiment, partitioning the generated reservoir model into a plurality of domains includes colorizing the generated reservoir model to generate blocks of nodes having a corresponding color code that is representative of a degree to which the blocks of nodes are isolated from other blocks of nodes; sorting the color colored blocks of nodes; weighting the sorted color coded blocks of nodes to account for processing costs associated with each; and allocating the weighted blocks of nodes to corresponding domains. In an exemplary embodiment, partitioning the generated reservoir model into a plurality of domains includes determining a level of processing cost associated with nodes within the generated reservoir model; sorting the nodes in a direction as a function of the processing cost associated with the nodes; summing the processing cost of the sorted nodes in the direction to determine a total processing cost associated with the direction; and assigning the nodes in the direction to corresponding domains to allocate the total processing cost in the direction. In an exemplary embodiment, partitioning the generated reservoir model into a plurality of domains includes determining a velocity field associated with the generated reservoir model; tracing streamlines associated with the velocity field; projecting the streamlines to generate stream curtains; and extending the stream curtains to boundaries of the generated reservoir model to partition the generated reservoir model into domains. In an exemplary embodiment, wherein partitioning the generated reservoir model into a plurality of domains further includes extending the stream curtains to boundaries of the generated reservoir model to partition the generated reservoir model into domains while avoiding intersection of the boundaries with wells defined within the generated reservoir model. In an exemplary embodiment, partitioning the generated reservoir model into a plurality of domains further includes generating multiple stream curtains; and extending the stream curtains to boundaries of the generated reservoir model to partition the generated reservoir model into multiple sets of domains. In an exemplary embodiment, partitioning the generated reservoir model into a plurality of domains further includes determining a processing cost distribution associated with each of the multiple sets of domains; and selecting a partition for the generated reservoir model from the multiple sets of domains having the best processing cost distribution. In an exemplary embodiment, partitioning the generated reservoir model into a plurality of domains includes determining a processing cost associated with each of the nodes of the generated reservoir model; determining a connectivity level between each of the nodes of the generated reservoir model; and partitioning the generated reservoir model into a plurality of domains as a function of the determined processing costs and connectivity levels. In an exemplary embodiment, partitioning the generated reservoir model into a plurality of domains as a function of the determined processing costs and connectivity levels includes evenly distributing the determined processing costs among the domains. In an exemplary embodiment, partitioning the generated reservoir model into a plurality of domains as a function of the determined processing costs and connectivity levels includes grouping nodes having a connectivity above a predetermined level within the same domains. In an exemplary embodiment, partitioning the generated reservoir model into a plurality of domains includes determining the distances between the boundaries of the domains and adjacent wells defined within the generated reservoir model; and re-partitioning the generated reservoir model as required as a function of the determined distances. In an exemplary embodiment, partitioning the generated reservoir model into a plurality of domains includes determining all nodes within the generated reservoir model positioned along boundaries between the domains; projecting the boundary nodes to a plane and fitting a curve through the projected boundary nodes; and projecting a curve in a direction orthogonal to the fitted curve to define boundaries between the domains of the generated reservoir model. In an exemplary embodiment, partitioning the generated reservoir model into a plurality of domains includes comparing the partitioning of the generated reservoir model with prior partitioning of the reservoir model.

A method for simulating a reservoir model has been described that includes generating the reservoir model; partitioning the generated reservoir model into a plurality of domains; dividing the simulating of the reservoir into a plurality of processing elements; processing a plurality of the processing elements in parallel; and partitioning the generated reservoir model into another plurality of domains at least once during the parallel processing; wherein partitioning the generated reservoir model into a plurality of domains includes a) pre-processing the reservoir model which can include but is not limited to choosing/changing the partitioning algorithm and determining/modifying the parameters for the already chosen partitioning algorithm; b) partitioning the generated reservoir model into a plurality of domains; c) post-processing the partitioned reservoir model to correct the partitioned reservoir model; d) evaluating a quality of the post-processed partitioned reservoir model; and e) if the quality of the post-processed partitioned reservoir model is less than a predetermined value, then repeating a, b, c, d and e.

A method for simulating a reservoir model has been described that includes generating the reservoir model; partitioning the generated reservoir model into a plurality of domains; dividing the simulating of the reservoir into a plurality of processing elements; processing a plurality of the processing elements in parallel; and partitioning the generated reservoir model into another plurality of domains at least once during the parallel processing; wherein partitioning the generated reservoir model into a plurality of domains includes determining a level of processing cost associated with nodes within the generated reservoir model; sorting the nodes as a function of the processing cost associated with the nodes; summing the processing cost of the sorted nodes to determine a total processing cost associated with the nodes; and assigning the nodes to corresponding domains to allocate the total processing cost among the domains.

A computer program for simulating a reservoir model embodied in a tangible medium has been described that includes instructions for: generating the reservoir model; partitioning the generated reservoir model into a plurality of domains; and simulating the partitioned reservoir model. In an exemplary embodiment, simulating the reservoir model includes dividing the simulating of the reservoir into a plurality of processing elements; and processing a plurality of the processing elements in parallel. In an exemplary embodiment, processing the plurality of the processing elements in parallel includes re-partitioning the generated reservoir model into a plurality of domains. In an exemplary embodiment, re-partitioning the generated reservoir model into a plurality of domains includes a) pre-processing the reservoir model which can include but is not limited to choosing/changing the partitioning algorithm and determining/modifying the parameters for the already chosen partitioning algorithm; b) partitioning the generated reservoir model into a plurality of domains; c) post-processing the partitioned reservoir model to correct the partitioned reservoir model; d)

evaluating a quality of the post-processed partitioned reservoir model; and e) if the quality of the post-processed partitioned reservoir model is less than a predetermined value, then repeating a, b, c, d and e. In an exemplary embodiment, simulating the reservoir model includes re-partitioning the reservoir model; dividing the simulating of the reservoir into a plurality of processing elements; and processing a plurality of the processing elements in parallel. In an exemplary embodiment, partitioning the generated reservoir model into a plurality of domains includes a) pre-processing the reservoir model which can include but is not limited to choosing/changing the partitioning algorithm and determining/modifying the parameters for the already chosen partitioning algorithm; b) partitioning the generated reservoir model into a plurality of domains; c) post-processing the partitioned reservoir model to correct the partition; d) evaluating a quality of the post-processed partitioned reservoir model; and e) if the quality of the post-process partitioned reservoir model is less than a predetermined value, then repeating a, b, c, d and e. In an exemplary embodiment, partitioning the generated reservoir model into a plurality of domains includes colorizing the generated reservoir model to generate blocks of nodes having a corresponding color code that is representative of a degree to which the blocks of nodes are isolated from other blocks of nodes; sorting the color colored blocks of nodes; weighting the sorted color coded blocks of nodes to account for processing costs associated with each; and allocating the weighted blocks of nodes to corresponding domains. In an exemplary embodiment, partitioning the generated reservoir model into a plurality of domains includes determining a level of processing cost associated with nodes within the generated reservoir model; sorting the nodes in a direction as a function of the processing cost associated with the nodes; summing the processing cost of the sorted nodes in the direction to determine a total processing cost associated with the direction; and assigning the nodes in the direction to corresponding domains to allocate the total processing cost in the direction. In an exemplary embodiment, partitioning the generated reservoir model into a plurality of domains includes determining a velocity field associated with the generated reservoir model; tracing streamlines associated with the velocity field; projecting the streamlines to generate stream currents; and extending the stream currents to boundaries of the generated reservoir model to partition the generated reservoir model into domains. In an exemplary embodiment, partitioning the generated reservoir model into a plurality of domains further includes extending the stream currents to boundaries of the generated reservoir model to partition the generated reservoir model into domains while avoiding intersection of the boundaries with wells defined within the generated reservoir model. In an exemplary embodiment, partitioning the generated reservoir model into a plurality of domains further includes generating multiple stream currents; and extending the stream currents to boundaries of the generated reservoir model to partition the generated reservoir model into multiple sets of domains. In an exemplary embodiment, partitioning the generated reservoir model into a plurality of domains further includes determining a processing cost distribution associated with each of the multiple sets of domains; and selecting a partition for the generated reservoir model from the multiple sets of domains having the best processing cost distribution. In an exemplary embodiment, partitioning the generated reservoir model into a plurality of domains includes determining a processing cost associated with each of the nodes of the generated reservoir model; determining a connectivity level between each of the nodes of the generated reservoir model; and partitioning the generated reservoir model into a plurality of domains as a function of the determined processing costs and connectivity levels. In an exemplary embodiment, partitioning the generated reservoir model into a plurality of domains as a function of the determined processing costs and connectivity levels includes evenly distributing the determined processing costs among the domains. In an exemplary embodiment, partitioning the generated reservoir model into a plurality of domains as a function of the determined processing costs and connectivity levels includes grouping nodes having a connectivity above a predetermined level within the same domains. In an exemplary embodiment, partitioning the generated reservoir model into a plurality of domains includes determining the distances between the boundaries of the domains and adjacent wells defined within the generated reservoir model; and re-partitioning the generated reservoir model as required as a function of the determined distances. In an exemplary embodiment, partitioning the generated reservoir model into a plurality of domains includes determining all nodes within the generated reservoir model positioned along boundaries between the domains; projecting the boundary nodes to a plane and fitting a curve through the projected boundary nodes; and projecting a curve in a direction orthogonal to the fitted curve to define boundaries between the domains of the generated reservoir model. In an exemplary embodiment, partitioning the generated reservoir model into a plurality of domains includes comparing the partitioning of the generated reservoir model with prior partitioning of the reservoir model.

A computer program for simulating a reservoir model embodied in a tangible medium has been described that includes instructions for: generating the reservoir model; partitioning the generated reservoir model into a plurality of domains; dividing the simulating of the reservoir into a plurality of processing elements; processing a plurality of the processing elements in parallel; and partitioning the generated reservoir model into another plurality of domains at least once during the parallel processing; wherein partitioning the generated reservoir model into a plurality of domains comprises: a) pre-processing the reservoir model which can include but is not limited to choosing/changing the partitioning algorithm and determining/modifying the parameters for the already chosen partitioning algorithm; b) partitioning the generated reservoir model into a plurality of domains; c) post-processing the partitioned reservoir model to correct the partitioned reservoir model; d) evaluating a quality of the post-processed partitioned reservoir model; and e) if the quality of the post-processed partitioned reservoir model is less than a predetermined value, then repeating a, b, c, d and e.

A computer program for simulating a reservoir model embodied in a tangible medium has been described that includes instructions for: generating the reservoir model; partitioning the generated reservoir model into a plurality of domains; dividing the simulating of the reservoir into a plurality of processing elements; processing a plurality of the processing elements in parallel; and partitioning the generated reservoir model into another plurality of domains at least once during the parallel processing; wherein partitioning the generated reservoir model into a plurality of domains comprises: determining a level of processing cost associated with nodes within the generated reservoir model; sorting the nodes as a function of the processing cost associated with the nodes; summing the processing cost of the sorted nodes to determine a total processing cost associated with the nodes; and assigning the nodes to corresponding domains to allocate the total processing cost among the domains.

A system for simulating a reservoir model has been described that includes means for generating the reservoir model; means for partitioning the generated reservoir model into a plurality of domains; and means for simulating the partitioned reservoir model. In an exemplary embodiment, means for simulating the reservoir model includes means for dividing the simulating of the reservoir into a plurality of processing elements; and means for processing a plurality of the processing elements in parallel. In an exemplary embodiment, means for processing the plurality of the processing elements in parallel includes means for re-partitioning the generated reservoir model into a plurality of domains. In an exemplary embodiment, means for re-partitioning the generated reservoir model into a plurality of domains includes a) pre-processing the reservoir model which can include but is not limited to choosing/changing the partitioning algorithm and determining/modifying the parameters for the already chosen partitioning algorithm; b) means for partitioning the generated reservoir model into a plurality of domains; c) means for post-processing the partitioned reservoir model to correct the partitioned reservoir model; d) means for evaluating a quality of the post-processed partitioned reservoir model; and e) means for if the quality of the post-processed partitioned reservoir model is less than a predetermined value, then means for repeating a, b, c, d, and e. In an exemplary embodiment, means for simulating the reservoir model includes means for re-partitioning the reservoir model; means for dividing the simulating of the reservoir into a plurality of processing elements; and means for processing a plurality of the processing elements in parallel. In an exemplary embodiment, means for partitioning the generated reservoir model into a plurality of domains includes a) pre-processing the reservoir model which can include but is not limited to choosing/changing the partitioning algorithm and determining/modifying the parameters for the already chosen partitioning algorithm: b) means for partitioning the generated reservoir model into a plurality of domains; c) means for post-processing the partitioned reservoir model to correct the partitioned reservoir model; d) means for evaluating a quality of the post-processed partitioned reservoir model; and e) means for if the quality of the post-process partitioned reservoir model is less than a predetermined value, then means for repeating a, b, c, d, and e. In an exemplary embodiment, means for partitioning the generated reservoir model into a plurality of domains includes means for colorizing the generated reservoir model to generate blocks of nodes having a corresponding color code that is representative of a degree to which the blocks of nodes are isolated from other blocks of nodes; means for sorting the color colored blocks of nodes; means for weighting the sorted color coded blocks of nodes to account for processing costs associated with each; and means for allocating the weighted blocks of nodes to corresponding domains. In an exemplary embodiment, means for partitioning the generated reservoir model into a plurality of domains includes means for determining a level of processing cost associated with nodes within the generated reservoir model; means for sorting the nodes in a direction as a function of the processing cost associated with the nodes; means for summing the processing cost of the sorted nodes in the direction to determine a total processing cost associated with the direction; and means for assigning the nodes in the direction to corresponding domains to allocate the total processing cost in the direction. In an exemplary embodiment, means for partitioning the generated reservoir model into a plurality of domains includes means for determining a velocity field associated with the generated reservoir model; means for tracing streamlines associated with the velocity field; means for projecting the streamlines to generate stream currents; and means for extending the stream currents to boundaries of the generated reservoir model to partition the generated reservoir model into domains. In an exemplary embodiment, means for partitioning the generated reservoir model into a plurality of domains further includes means for extending the stream currents to boundaries of the generated reservoir model to partition the generated reservoir model into domains while avoiding intersection of the boundaries with wells defined within the generated reservoir model. In an exemplary embodiment, means for partitioning the generated reservoir model into a plurality of domains further includes means for generating multiple stream currents; and means for extending the stream currents to boundaries of the generated reservoir model to partition the generated reservoir model into multiple sets of domains. In an exemplary embodiment, means for partitioning the generated reservoir model into a plurality of domains further includes means for determining a processing cost distribution associated with each of the multiple sets of domains; and means for selecting a partition for the generated reservoir model from the multiple sets of domains having the best processing cost distribution. In an exemplary embodiment, means for partitioning the generated reservoir model into a plurality of domains includes mans for determining a processing cost associated with each of the nodes of the generated reservoir model; means for determining a connectivity level between each of the nodes of the generated reservoir model; and means for partitioning the generated reservoir model into a plurality of domains as a function of the determined processing costs and connectivity levels. In an exemplary embodiment, means for partitioning the generated reservoir model into a plurality of domains as a function of the determined processing costs and connectivity levels includes means for evenly distributing the determined processing costs among the domains. In an exemplary embodiment, means for partitioning the generated reservoir model into a plurality of domains as a function of the determined processing costs and connectivity levels includes means for grouping nodes having a connectivity above a predetermined level within the same domains. In an exemplary embodiment, means for partitioning the generated reservoir model into a plurality of domains includes means for determining the distances between the boundaries of the domains and adjacent wells defined within the generated reservoir model; and means for re-partitioning the generated reservoir model as required as a function of the determined distances. In an exemplary embodiment, means for partitioning the generated reservoir model into a plurality of domains includes means for determining all nodes within the generated reservoir model positioned along boundaries between the domains; means for projecting the boundary nodes to a plane and fitting a curve through the projected boundary nodes; and means for projecting a curve in a direction orthogonal to the fitted curve to define boundaries between the domains of the generated reservoir model. In an exemplary embodiment, means for partitioning the generated reservoir model into a plurality of domains includes means for comparing the partitioning of the generated reservoir model with prior partitioning of the reservoir model.

A system for simulating a reservoir model has been described that includes means for generating the reservoir model; means for partitioning the generated reservoir model into a plurality of domains; means for dividing the simulating of the reservoir into a plurality of processing elements; means for processing a plurality of the processing elements in parallel; and means for partitioning the generated reservoir model into another plurality of domains at least once during the parallel processing; wherein means for partitioning the generated reservoir model into a plurality of domains comprises: a) pre-processing the reservoir model which can include but is not limited to choosing/changing the partitioning algorithm and determining/modifying the parameters for the already chosen partitioning algorithm; b) means for partitioning the generated reservoir model into a plurality of domains; c) means for post-processing the partitioned reservoir model to correct the partitioned reservoir model; d) means for evaluating a quality of the post-processed partitioned reservoir model; and e) means for if the quality of the post-processed partitioned reservoir model is less than a predetermined value, then means for repeating a, b, c, d, and e.

A system for simulating a reservoir model has been described that includes means for generating the reservoir model; means for partitioning the generated reservoir model into a plurality of domains; means for dividing the simulating of the reservoir into a plurality of processing elements; means for processing a plurality of the processing elements in parallel; and means for partitioning the generated reservoir model into another plurality of domains at least once during the parallel processing; wherein means for partitioning the generated reservoir model into a plurality of domains includes means for determining a level of processing cost associated with nodes within the generated reservoir model; means for sorting the nodes as a function of the processing cost associated with the nodes; means for summing the processing cost of the sorted nodes to determine a total processing cost associated with the nodes; and means for assigning the nodes to corresponding domains to allocate the total processing cost among the domains.

It is understood that variations may be made in the foregoing without departing from the scope of the invention. For example, the teachings of the present illustrative embodiments may be used to enhance the computational efficiency of other types of n-dimensional computer models that include grid structures.

Although illustrative embodiments of the invention have been shown and described, a wide range of modification, changes and substitution is contemplated in the foregoing disclosure. In some instances, some features of the present invention may be employed without a corresponding use of the other features. Accordingly, it is appropriate that the appended claims be construed broadly and in a manner consistent with the scope of the invention.

What is claimed is:

1. A method of simulating a reservoir model, comprising:
generating the reservoir model;
partitioning the generated reservoir model into multiple sets of different domains, each domain corresponding to a partition for a specific portion of the model that optimizes parallel processing efficiency of the reservoir simulation;
re-partitioning the generated reservoir model into a plurality of domains dynamically in order to improve parallel performance, wherein the re-partitioning comprises:
a) pre-processing the reservoir model by choosing a partitioning scheme and determining parameters of the partitioning scheme;
b) partitioning the generated reservoir model into a plurality of domains using the partitioning scheme;
c) post-processing the partitioned reservoir model to further refine the parallel performance of a partitioned calculation;
d) evaluating a quality of the post-processed partitioned reservoir model; and
e) if the quality of the post-processed partitioned reservoir model is less than a predetermined value, then repeating a, b, c, d, and e using a modified partitioning scheme and parameters;
dividing the simulating of the reservoir model into a plurality of processing elements; and
processing a plurality of the processing elements in parallel, based on the re-partitioned reservoir model;
wherein partitioning the generated reservoir model into a plurality of domains comprises:
identifying subsets or blocks of nodes which are isolated from each other;
sorting the identified subsets or blocks of nodes by size;
weighting the sorted subsets or blocks of nodes to account for processing costs associated with each subset or block;
sorting the weighted subsets or blocks of nodes based on processing cost; and
allocating the weighted subsets or blocks of nodes to corresponding domains.

2. A method of simulating a reservoir model, comprising:
generating the reservoir model;
partitioning the generated reservoir model into multiple sets of different domains, each domain corresponding to a partition for a specific portion of the model that optimizes parallel processing efficiency of the reservoir simulation;
re-partitioning the generated reservoir model into a plurality of domains dynamically in order to improve parallel performance, wherein the re-partitioning comprises:
a) pre-processing the reservoir model by choosing a partitioning scheme and determining parameters of the partitioning scheme;
b) partitioning the generated reservoir model into a plurality of domains using the partitioning scheme;
c) post-processing the partitioned reservoir model to further refine the parallel performance of a partitioned calculation;
d) evaluating a quality of the post-processed partitioned reservoir model; and
e) if the quality of the post-processed partitioned reservoir model is less than a predetermined value, then repeating a, b, c, d, and e using a modified partitioning scheme and parameters;
dividing the simulating of the reservoir model into a plurality of processing elements; and
processing a plurality of the processing elements in parallel, based on the re-partitioned reservoir model;
wherein partitioning the generated reservoir model into a plurality of domains comprises:
determining a velocity field associated with the generated reservoir model;
tracing streamlines associated with the velocity field;
projecting the streamlines to generate streamline curtains; and
extending the streamline curtains to boundaries of the generated reservoir model to partition the generated reservoir model into domains.

3. A method of simulating a reservoir model, comprising:
generating the reservoir model;
partitioning the generated reservoir model into multiple sets of different domains, each domain corresponding to a partition for a specific portion of the model that optimizes parallel processing efficiency of the reservoir simulation;
re-partitioning the generated reservoir model into a plurality of domains dynamically in order to improve parallel performance, wherein the re-partitioning comprises:
a) pre-processing the reservoir model by choosing a partitioning scheme and determining parameters of the partitioning scheme;

b) partitioning the generated reservoir model into a plurality of domains using the partitioning scheme;
c) post-processing the partitioned reservoir model to further refine the parallel performance of a partitioned calculation;
d) evaluating a quality of the post-processed partitioned reservoir model; and
e) if the quality of the post-processed partitioned reservoir model is less than a predetermined value, then repeating a, b, c, d, and e using a modified partitioning scheme and parameters;

dividing the simulating of the reservoir model into a plurality of processing elements; and
processing a plurality of the processing elements in parallel, based on the re-partitioned reservoir model;
wherein partitioning the generated reservoir model into a plurality of domains comprises:
partitioning the domains;
determining distances between boundaries of the domains and adjacent wells defined within the generated reservoir model; and
re-partitioning the generated reservoir model as required as a function of the determined distances in order to move the domain partition away from the wells and thus improve a solver performance.

4. The method of claim 3, wherein partitioning the domains comprises:
identifying subsets or blocks of nodes which are isolated from each other;
sorting the identified subsets or blocks of nodes by size;
weighting the sorted subsets or blocks of nodes to account for processing costs associated with each subset or block;
sorting the weighted subsets or blocks of nodes based on processing cost; and
allocating the weighted subsets or blocks of nodes to corresponding domains.

5. The method of claim 3, wherein partitioning the domains comprises:
determining a level of processing cost associated with each node within the generated reservoir model;
sorting nodes in a geometric direction as a function of the determined level of processing cost;
summing computational weight factors of the sorted nodes;
binning the sorted nodes based on the processing cost to generate bins of equal weight; and
assigning each bin of sorted nodes from the bins to one of the plurality of domains.

6. The method of claim 3, wherein partitioning the domains comprises:
determining a velocity field associated with the generated reservoir model;
tracing streamlines associated with the velocity field;
projecting the streamlines to generate streamline curtains; and
extending the streamline curtains to boundaries of the generated reservoir model to partition the generated reservoir model into domains.

7. The method of claim 3, wherein partitioning the domains comprises:
determining a processing cost associated with each node of the generated reservoir model;
determining a processing cost associated with the connectivity level between each of the nodes of the generated reservoir model; and partitioning the generated reservoir model into a plurality of domains as a function of the determined processing cost.

8. A method of simulating a reservoir model, comprising:
generating the reservoir model;
partitioning the generated reservoir model into multiple sets of different domains, each domain corresponding to a partition for a specific portion of the model that optimizes parallel processing efficiency of the reservoir simulation;
re-partitioning the generated reservoir model into a plurality of domains dynamically in order to improve parallel performance, wherein the re-partitioning comprises:
a) pre-processing the reservoir model by choosing a partitioning scheme and determining parameters of the partitioning scheme;
b) partitioning the generated reservoir model into a plurality of domains using the partitioning scheme;
c) post-processing the partitioned reservoir model to further refine the parallel performance of a partitioned calculation;
d) evaluating a quality of the post-processed partitioned reservoir model; and
e) if the quality of the post-processed partitioned reservoir model is less than a predetermined value, then repeating a, b, c, d, and e using a modified partitioning scheme and parameters;

dividing the simulating of the reservoir model into a plurality of processing elements; and
processing a plurality of the processing elements in parallel, based on the re-partitioned reservoir model;
wherein partitioning the generated reservoir model into a plurality of domains comprises:
partitioning the domains;
determining all nodes within the generated reservoir model positioned along boundaries between the domains;
projecting the boundary nodes to a plane and fitting a curve through the projected boundary nodes; and
projecting a curve in a direction orthogonal to the fitted curve to redefine boundaries between the domains of the generated reservoir model.

9. A method for simulating a reservoir model, comprising:
generating the reservoir model;
partitioning the generated reservoir model into a plurality of domains;
dividing the simulating of the reservoir model into a plurality of processing elements;
processing a plurality of the processing elements in parallel; and
partitioning the generated reservoir model into another plurality of domains at least once during the parallel processing;
wherein partitioning the generated reservoir model into a plurality of domains comprises:
a) pre-processing the reservoir model by choosing a partitioning scheme and determining parameters of the partitioning scheme;
b) partitioning the generated reservoir model into a plurality of domains using a partition scheme;
c) post-processing the partitioned reservoir model to correct the partitioned reservoir model;
d) evaluating a quality of the post-processed partitioned reservoir model; and
e) if the quality of the post-processed partitioned reservoir model is less than a predetermined value, then repeating a, b, c, and d, and e with a modified partitioning scheme and/or parameters of the partitioning scheme;

wherein partitioning the domains comprises:
    identifying subsets or blocks of nodes which are isolated from each other;
    sorting the identified subsets or blocks of nodes by size;
    weighting the sorted blocks of nodes to account for processing costs associated with each block or subset;
    sorting the weighted subsets or blocks of nodes based on the processing costs; and
    allocating the weighted subsets or blocks of nodes to corresponding domains.

10. A method for simulating a reservoir model, comprising:
    generating the reservoir model;
    partitioning the generated reservoir model into a plurality of domains;
    dividing the simulating of the reservoir model into a plurality of processing elements;
    processing a plurality of the processing elements in parallel; and
    partitioning the generated reservoir model into another plurality of domains at least once during the parallel processing;
    wherein partitioning the generated reservoir model into a plurality of domains comprises:
        a) pre-processing the reservoir model by choosing a partitioning scheme and determining parameters of the partitioning scheme;
        b) partitioning the generated reservoir model into a plurality of domains using a partition scheme;
        c) post-processing the partitioned reservoir model to correct the partitioned reservoir model;
        d) evaluating a quality of the post-processed partitioned reservoir model; and
        e) if the quality of the post-processed partitioned reservoir model is less than a predetermined value, then repeating a, b, c, and d, and e with a modified partitioning scheme and/or parameters of the partitioning scheme;
    wherein partitioning the domains comprises:
        determining a velocity field associated with the generated reservoir model;
        tracing streamlines associated with the velocity field;
        projecting the streamlines to generate streamline curtains; and
        extending the streamline curtains to boundaries of the generated reservoir model to partition the generated reservoir model into domains.

* * * * *